(12) United States Patent
Ko et al.

(10) Patent No.: US 12,592,685 B2
(45) Date of Patent: Mar. 31, 2026

(54) FLIP-FLOPS AND INTEGRATED CIRCUITS INCLUDING THE SAME

(71) Applicant: SAMSUNG ELECTRONICS CO., LTD., Suwon-si (KR)

(72) Inventors: Dongmin Ko, Suwon-si (KR); Dongkwon Lee, Seoul (KR); Dongsuk Jeon, Seoul (KR); Youngdon Choi, Suwon-si (KR)

(73) Assignees: Samsung Electronics Co., Ltd., Suwon-si (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 18/789,521

(22) Filed: Jul. 30, 2024

(65) Prior Publication Data

US 2025/0286543 A1     Sep. 11, 2025

(30) Foreign Application Priority Data

Mar. 7, 2024     (KR) ........................ 10-2024-0032325

(51) Int. Cl.
*H03K 3/356* (2006.01)
*H03K 3/012* (2006.01)

(52) U.S. Cl.
CPC ....... *H03K 3/356113* (2013.01); *H03K 3/012* (2013.01)

(58) Field of Classification Search
CPC ......................... H03K 3/012; H03K 3/356113
See application file for complete search history.

(56) References Cited

U.S. PATENT DOCUMENTS

| | | | |
|---|---|---|---|
| 6,448,831 B1 | 9/2002 | Hunt, Jr. et al. | |
| 10,715,118 B2 * | 7/2020 | Agarwal | H03K 3/35625 |
| 10,812,055 B2 | 10/2020 | Mittal et al. | |
| 11,575,366 B2 | 2/2023 | Hwang | |
| 11,789,075 B1 * | 10/2023 | Baksh | G01R 31/3177 |
| | | | 714/731 |
| 11,962,303 B1 * | 4/2024 | Dao | H03K 19/01855 |
| 2013/0088273 A1 * | 4/2013 | Sathianthan | H03K 3/35625 |
| | | | 327/200 |
| 2022/0337231 A1 * | 10/2022 | Hwang | H03K 3/037 |

FOREIGN PATENT DOCUMENTS

| | | |
|---|---|---|
| KR | 1231237 | 2/2013 |
| KR | 2218879 | 2/2021 |
| KR | 20220112096 | 8/2022 |

* cited by examiner

*Primary Examiner* — Sibin Chen
(74) *Attorney, Agent, or Firm* — Fish & Richardson P.C.

(57) ABSTRACT

A flip-flop includes a first precharge circuit, a first discharge circuit, a first inverter, a second discharge circuit, a second precharge circuit, a third discharge circuit, and a switching prevention circuit. The first precharge circuit selectively charges a first node based on a data input signal and a clock signal. The first discharge circuit selectively discharges the first node based on the data input signal. The first inverter outputs a first inverted signal by inverting a first signal of the first node. The second discharge circuit selectively discharges the second node based on the clock signal. The third discharge circuit selectively discharges the fourth node based on the clock signal, the first inverted signal and the second signal. The switching prevention circuit prevents a switching of a voltage level of the second node based on the first signal, due to a toggling of the clock signal.

20 Claims, 26 Drawing Sheets

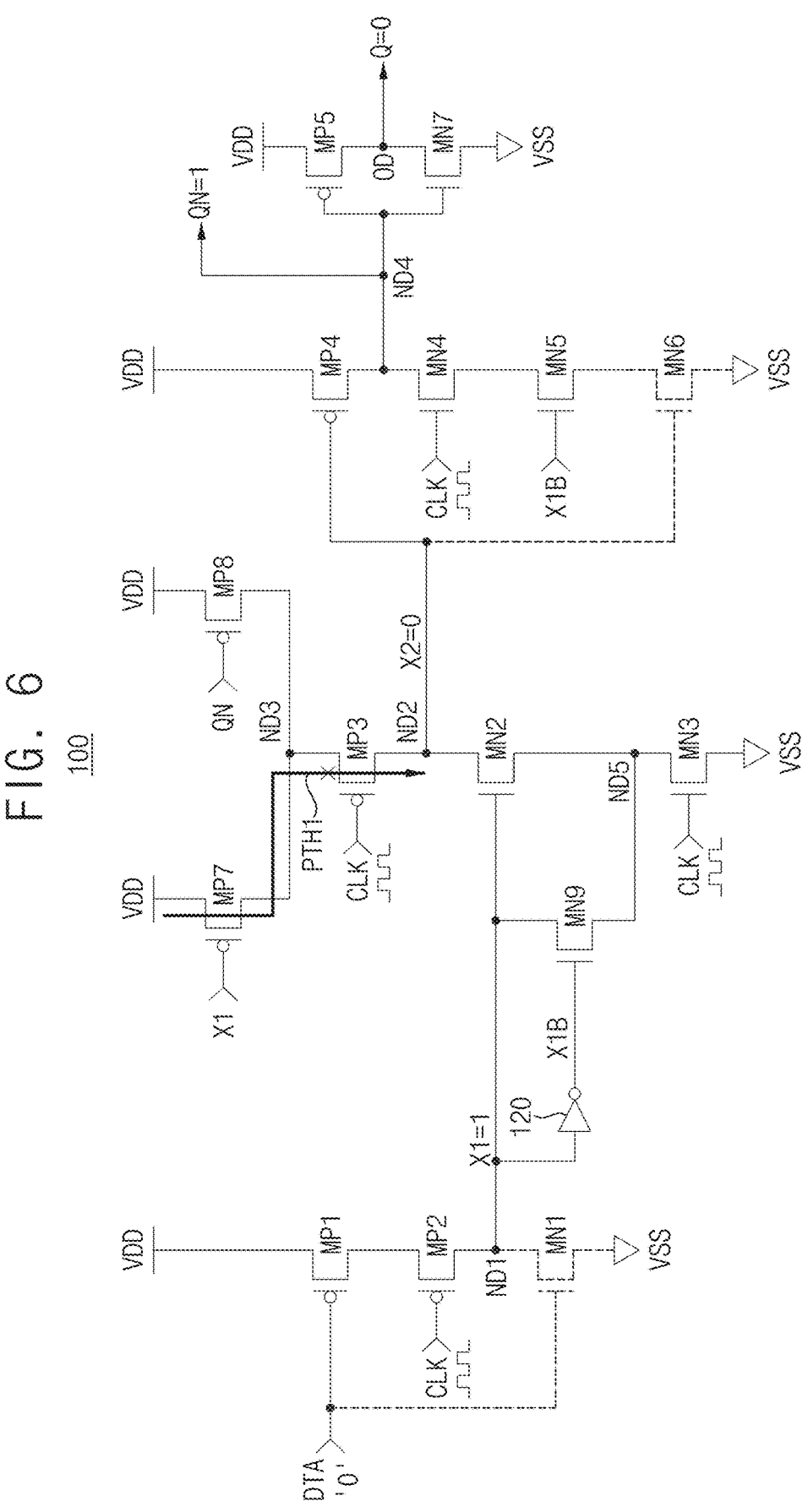
F I G. 6
100

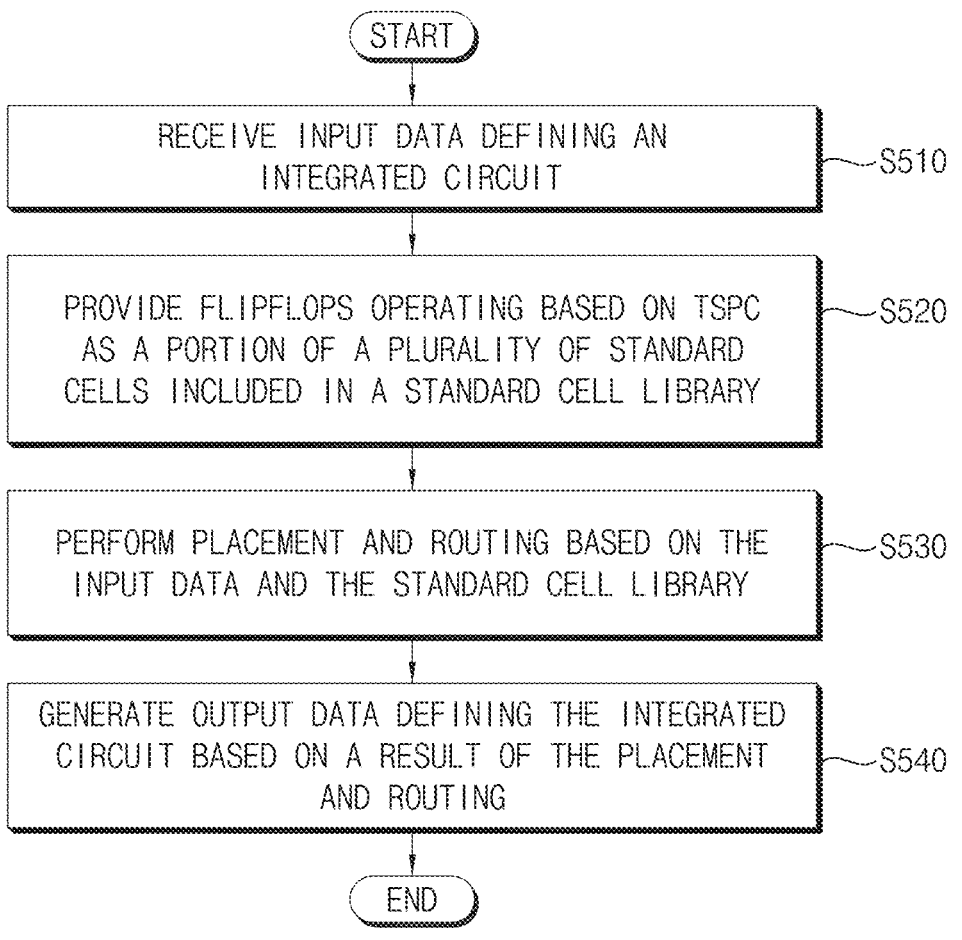

START

RECEIVE INPUT DATA DEFINING AN
INTEGRATED CIRCUIT ——S510

PROVIDE FLIPFLOPS OPERATING BASED ON TSPC
AS A PORTION OF A PLURALITY OF STANDARD
CELLS INCLUDED IN A STANDARD CELL LIBRARY ——S520

PERFORM PLACEMENT AND ROUTING BASED ON THE
INPUT DATA AND THE STANDARD CELL LIBRARY ——S530

GENERATE OUTPUT DATA DEFINING THE INTEGRATED
CIRCUIT BASED ON A RESULT OF THE PLACEMENT
AND ROUTING ——S540

END

FLIP-FLOPS AND INTEGRATED CIRCUITS INCLUDING THE SAME

CROSS-REFERENCE TO RELATED APPLICATION

This application claims priority under 35 U.S.C. § 119 to Korean Patent Application No. 10-2024-0032325, filed on Mar. 7, 2024, in the Korean Intellectual Property Office, the disclosure of which is incorporated by reference herein in its entirety.

BACKGROUND

An integrated circuit may include a plurality of sequential circuits. A sequential circuit may indicate/refer to a circuit for outputting output data based on input data and on data previously stored. The sequential circuit may be or may include, for example, a latch, a flip-flop and/or an integrated clock gating cell. An output from the sequential circuit may be input to a combinational logic circuit for performing a function of the integrated circuit, and an output from the combinational logic circuit may be input to another sequential circuit and/or to the outside.

Because the amount of logical operations performed by combinational logic circuits increases as integrated circuits become more advanced, there may be a long delay between the output of a sequential circuit being passed to the combinational logic circuit and from the combinational logic circuit to the next sequential circuit. For solving this problem, a semi-dynamic flip-flop, which is a combination of a dynamic circuit and a static circuit, is widely adopted.

However, glitches occur depending on a speed at which the input node of the static circuit is discharged and a speed at which the static circuit is discharged, and when the glitch occurs, all devices are turned on, resulting in power consumption.

SUMMARY

Implementations of the present disclosure may provide a flip-flop capable of increasing data retention time and capable of reducing power consumption.

Implementations of the present disclosure may provide an integrated circuit that includes a flip-flop capable of increasing data retention time and capable of reducing power consumption.

According to some implementations of the present disclosure, a flip-flop includes a first precharge circuit, a first discharge circuit, a first inverter, a switching circuit, a second discharge circuit, a second precharge circuit, a third discharge circuit, a second inverter and a switching prevention circuit. The first precharge circuit is connected between a power supply voltage and a first node, and selectively charges the first node based on a data input signal and a clock signal. The first discharge circuit is connected between the first node and a ground voltage, and selectively discharges the first node based on the data input signal. The first inverter outputs a first inverted signal by inverting a first signal of the first node. The switching circuit selectively connects a second node and a third node based on the clock signal. The second discharge circuit is connected between the second node and the ground voltage, and selectively discharges the second node based on the clock signal. The second precharge circuit is connected between the power supply voltage and a fourth node, and selectively charges the fourth node based on a second signal of the second node.

The third discharge circuit is connected between the fourth node and the ground voltage, and selectively discharges the fourth node based on the clock signal, the first inverted signal and the second signal. The second inverter provides an output signal by inverting an inverted output signal of the fourth node. The switching prevention circuit is connected between the power supply voltage and the third node, prevents a switching of a voltage level of the second node based on the first signal, and the switching of a voltage level of the second node occurs due to a toggling of the clock signal.

According to some implementations of the present disclosure, a flip-flop includes a first p-channel metal-oxide semiconductor (PMOS) transistor, a second PMOS transistor, a first n-channel metal-oxide semiconductor (NMOS) transistor, a third PMOS transistor, a second NMOS transistor, a third NMOS transistor, a first inverter, a fourth NMOS transistor, a fifth NMOS transistor, a sixth NMOS transistor, a second inverter, a fifth PMOS transistor and a sixth PMOS transistor. The first PMOS transistor includes a source coupled to a power supply voltage and a gate to receive a data input signal. The second PMOS transistor is connected between the first PMOS transistor and a first node, and includes a gate to receive a clock signal. The first NMOS transistor is connected between the first node and a ground voltage, and includes a gate to receive the data input signal. The third PMOS transistor is connected between a second node and a third node, and includes a gate to receive the clock signal. The second NMOS transistor includes a drain coupled to the second node and a gate coupled to the first node. The third NMOS transistor is connected between the second NMOS transistor and the ground voltage, and includes a gate to receive the clock signal. The first inverter output a first inverted signal by inverting a first signal of the first node. The fourth PMOS transistor is connected between the power supply voltage and a fourth node, and includes a gate coupled to the second node. The fourth NMOS transistor includes a drain coupled to the fourth node and a gate to receive the clock signal. The fifth NMOS transistor includes a drain coupled to the fourth NMOS transistor and a gate to receive the first inverted signal. The sixth NMOS transistor is connected between the fifth NMOS transistor and the ground voltage, and includes a gate coupled to the second node. The second inverter provides an output signal by inverting an inverted output signal of the fourth node. The fifth PMOS transistor is connected between the power supply voltage and the third node, and includes a gate to receive the first signal. The sixth PMOS transistor is connected between the power supply voltage and the third node in parallel with the fifth PMOS transistor, and includes a gate to receive the inverted output signal.

According to some implementations of the present disclosure, a semiconductor memory device includes a clock generator and a plurality of flip-flops. The clock generator generates a clock signal having a true single phase. The plurality of flip-flops operate based on the clock signal and are connected in series. Each of the plurality of flip-flops includes a first precharge circuit, a first discharge circuit, a first inverter, a switching circuit, a second discharge circuit, a second precharge circuit, a third discharge circuit, a second inverter, a switching prevention circuit, a first a retention strengthening circuit and a second retention strengthening circuit. The first precharge circuit is connected between a power supply voltage and a first node, and selectively charges the first node based on a data input signal and the clock signal. The first discharge circuit is connected between the first node and a ground voltage, and selectively discharges the first node based on the data input signal. The first inverter outputs a first inverted signal by inverting a first signal of the first node. The switching circuit selectively connects a second node and a third node based on the clock signal. The second discharge circuit is connected between the second node and the ground voltage, and selectively discharges the second node based on the clock signal. The second precharge circuit is connected between the power supply voltage and a fourth node, and selectively charges the fourth node based on a second signal of the second node. The third discharge circuit is connected between the fourth node and the ground voltage, and selectively discharges the fourth node based on the clock signal, the first inverted signal and the second signal. The second inverter provides an output signal by inverting an inverted output signal of the fourth node. The switching prevention circuit is connected between the power supply voltage and the third node, prevents a switching of a voltage level of the second node based on the first signal, and the switching of a voltage level of the second node occurs due to a toggling of the clock signal. The first a retention strengthening circuit is connected between the power supply voltage and the third node in parallel with the switching prevention circuit, and maintains a logic level of the second signal based on the inverted output signal. The second retention strengthening circuit is connected between the first node and a fifth node in the second discharge circuit, and maintains a logic level of the first node based on the first inverted signal.

Accordingly, the flip-flop according to some implementations, may reduce power consumption due to toggling of the clock signal by reducing (e.g., minimizing) a number of the transistors that receive the clock signal and by including the switching prevention circuit, may increase retention time of logic levels of internal nodes to enhance performance and to applicable frequency range by including the first retention strengthening circuit and the second retention strengthening circuit and may prevent a glitch from occurring at the fourth node by including the third discharge circuit that includes the NMOS transistor having a gate to receive the first inverted signal.

BRIEF DESCRIPTION OF THE DRAWINGS

Implementations of the present disclosure will be described below in more detail with reference to the accompanying drawings.

FIG. 2 illustrates an example a true single-phase clock (TSPC) flip-flop at a transistor level.

FIG. 6 illustrates an example operation of the switching prevention circuit in the flip-flop of FIG. 5 according to some implementations.

FIG. 12A is a circuit diagram illustrating an example of a flip-flop according to some implementations.

FIGS. 12B and 12C illustrate charging operation and discharging operation on the first node in the flip-flop of FIG. 12A, respectively.

FIGS. 12D and 12E illustrate charging operation and discharging operation on the second node in the flip-flop of FIG. 12A, respectively FIGS. 12F and 12G illustrate charging operation and discharging operation on the fourth node in the flip-flop of FIG. 12A, respectively.

FIG. 13A is a circuit diagram illustrating an example of a flip-flop according to some implementations.

FIG. 13B is a circuit diagram illustrating an example of a flip-flop according to some implementations.

FIG. 20 is a flow chart illustrating a method of designing an integrated circuit according to some implementations.

DETAILED DESCRIPTION

Various implementations of the present disclosure will be described more fully hereinafter with reference to the accompanying drawings, in which implementations are shown.

Figure 1:
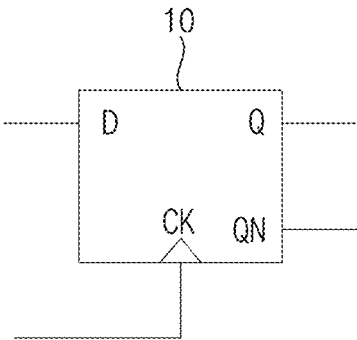
FIG. 1 is a diagram illustrating a logic symbol of a data flip-flop according to some implementations.

FIG. 1 is a diagram illustrating a logic symbol of a data flip-flop according to some implementations.

Referring to FIG. 1, a data flip-flop 10 may receive a data input signal D and may output an output signal Q and/or an inverted output signal QN by latching the data input signal D based on a clock signal CK.

The data flip-flop 10 of FIG. 1 may be implemented with a transmission-gate flip-flop (TGFF). The TGFF may include a transmission gate that receives a clock signal CK and an inverted clock signal. Because the TGFF uses both the clock signal CK and the inverted clock signal having an opposite phase to the clock signal CK, the TGFF may operate according to a two-phase clock. The TGFF may be configured to receive the clock signal CK through two inverters, and when the data input signal D has not transited or toggled, the TGFF may consistently or continuously consume power according to the transition of the clock signal CK.

Alternatively, the data flip-flop 10 may be implemented with a true single-phase clocking (TSPC) flip-flop. The TSPC flip-flop may use one clock signal, for example, the clock signal CK only. For example, the TSPC flip-flop may not use the inverted clock signal. However, a dynamic circuit of the TSPC flip-flop is repeatedly precharged and discharged. The repetitive pre-charging and discharging of the dynamic circuit are based on clock signal transition and may occur even though the data input signal D has not changed.

Figure 2:
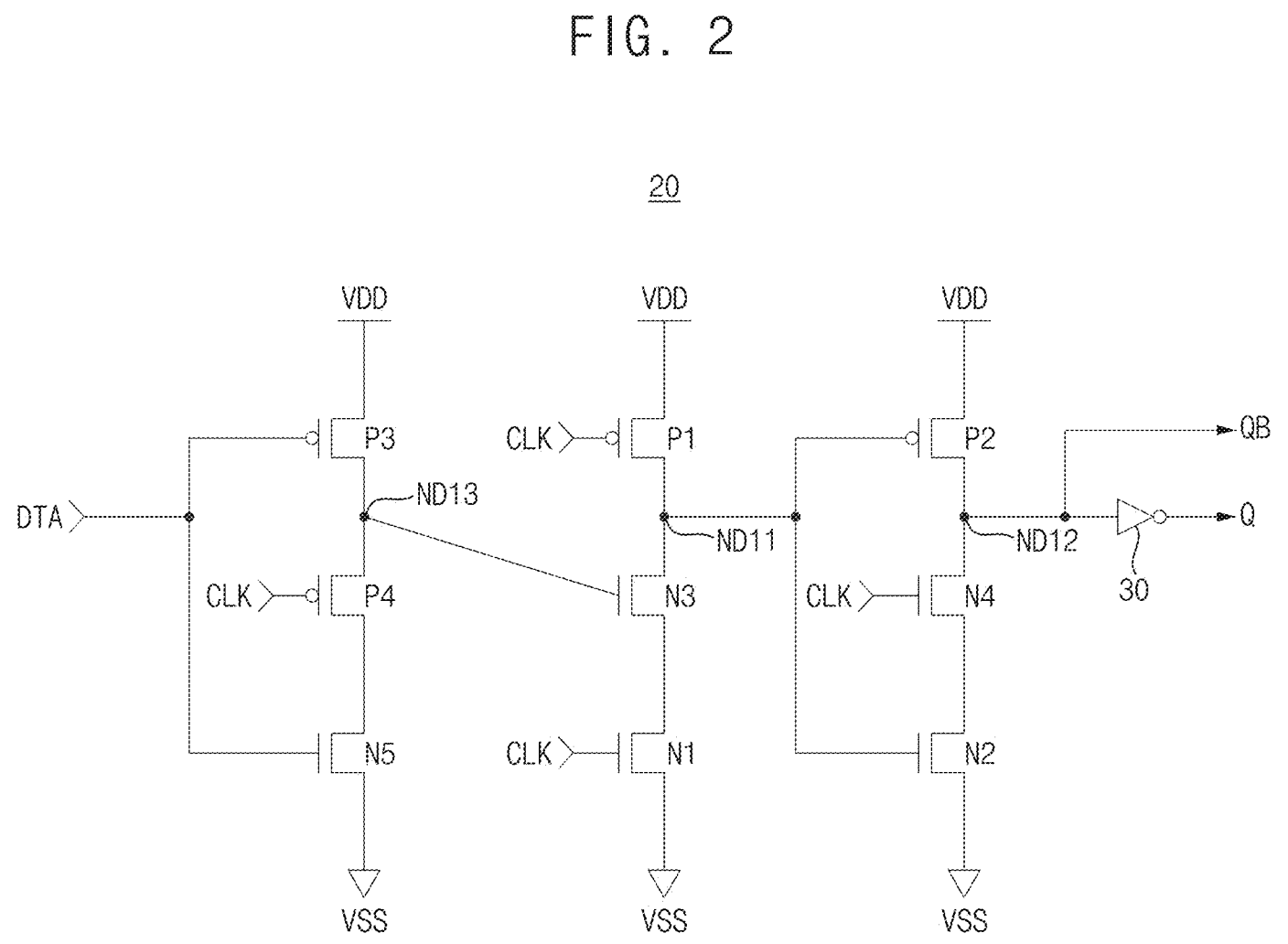

FIG. 2 illustrates an example a TSPC flip-flop at a transistor level.

Referring to FIG. 2, a TSPC flip-flop 20 includes p-channel metal-oxide semiconductor (PMOS) transistors P1, P2, P3 and P4, n-channel metal-oxide semiconductor (NMOS) transistors N1, N2, N3, N4 and N5 and an inverter 30.

The PMOS transistor P3 may be connected between a power supply voltage VDD and a third node ND13, and may have a gate to receive a data input signal DTA. The PMOS transistor P4 may be connected between the third node ND13 and the NMOS transistor N5 and may have a gate to receive a clock signal CLK. The NMOS transistor N5 may be connected between the PMOS transistor P4 and a ground voltage VSS, and may have a gate to receive the data input signal DTA.

The PMOS transistor P1 may be connected between the power supply voltage VDD and a first node ND11, and may have a gate to receive the clock signal CLK. The NMOS transistor N3 may be connected between the PMOS transistor P1 and the NMOS transistor N1, and may have gate coupled to the third node ND13. The NMOS transistor N1 may be connected between the NMOS transistor N3 and the ground voltage VSS, and may have a gate to receive the clock signal CLK.

The PMOS transistor P2 may be connected between the power supply voltage VDD and a second node ND12, and may have a gate coupled to the first node ND11. The NMOS transistor N4 may be connected between the PMOS transistor P2 and the NMOS transistor N2, and may have a gate to receive the clock signal CLK. The NMOS transistor N2 may be connected between the NMOS transistor N4 and the ground voltage VSS, and may have a gate coupled to the first node ND11.

The inverter 30 may provide an output signal Q by inverting an inverted output signal QN at the second node ND12.

While the clock signal CLK is logic low, a precharge operation may be performed. The clock signal CLK may be input to the gate of the PMOS transistor P1. When the clock signal CLK with "logic low" is input to the gate of the PMOS transistor P1, the PMOS transistor P1 may be turned on. When the PMOS transistor P1 is turned on, a source and a drain of the first PMOS transistor P1 may be electrically connected to each other. Because the first node ND11 connected to the drain of the PMOS transistor P1 is electrically coupled to the power supply VDD, a voltage level of the first node ND11 may be precharged to a voltage level of the power supply voltage VDD.

When the clock signal CLK with "logic low" is input to the gate of the NMOS transistor N1, the NMOS transistor N1 may be turned off. Therefore, a voltage level of the first node ND11 charged by the power supply voltage VDD may be maintained without dropping.

When the data input signal DTA is "logic low," the PMOS transistor P3 may be turned on, and because the clock signal CLK is "logic low," the PMOS transistor P4 may also be turned on. Therefore, the third node ND13 coupled to the gate of the NMOS transistor N4 may be precharged to "logic high." Because the data input signal DTA, which is input to the gate of the NMOS transistor N5, is "logic low," the NMOS transistor N5 may be turned off, and accordingly, a voltage level of the third node ND13, which is precharged to "logic high," may be maintained e.g. at the "logic high" level without or with reduced dropping.

When the clock signal CLK transits or toggles from "logic low" to "logic high," an evaluation operation may be performed. When the clock signal CLK with "logic high" is input to the gate of the PMOS transistor P1, the PMOS transistor P1 may be turned off. For example, the source and the drain of the PMOS transistor P1 may be electrically open.

Because the data input signal DTA is maintained at "logic low," the NMOS transistor N5 may still be off, and thus, the third node ND13 may not be electrically coupled to the ground voltage VSS. Therefore, the voltage level of the third node ND13 may remain "logic high." Because the voltage level of the third node ND13 is "logic high," the NMOS transistor N3 may be turned on, and because the clock signal CLK transits to "logic high," the NMOS transistor N1 may also be turned on. For example, as the NMOS transistor N1 and the NMOS transistor N3 are turned on, the first node ND11 may be coupled to the ground voltage VSS, and the first node ND11 may start being discharged.

The first node ND11 may be coupled to the gate of each of the PMOS transistor P2 and the NMOS transistor N2. When the voltage level of the first node ND11 transits or toggles from "logic high" to "logic low" according to the discharge of the first node ND11, the PMOS transistor P2 may be turned on, and the NMOS transistor N2 may be turned off. For example, the NMOS transistor N4 and the second NMOS transistor N2 corresponding to a discharge path of the second node ND12 are turned off, and the PMOS transistor P2 corresponding to a path for an electrical connection with the power supply voltage VDD is turned on. Thus, the second node ND12 may be charged to "logic high".

According to some implementations, the NMOS transistor N2 may be turned on in a certain period of time from a point in time when the clock signal CLK transits to "logic high". For example, although the clock signal CLK transits or toggles to "logic high", the voltage level of the first node ND11, which is precharged through the power supply voltage VDD, is discharged according to a constant gradient, e.g. at a constant rate of change. For example, while the voltage level of the first node ND11 is discharged to half ($\frac{1}{2}$*VDD) of the power supply voltage VDD, the NMOS transistor N2 may keep being on, e.g., may keep allowing current to flow from source to drain. Therefore, the second node ND12 may be coupled to the ground voltage VSS through the NMOS transistor N4 and the NMOS transistor N2. Therefore, in a period of time before the voltage level of the first node ND11 is discharged to the half ($\frac{1}{2}$*VDD) of the power supply voltage VDD, the second node ND12 may also be discharged.

According to some implementations, the NMOS transistor N2 may be turned off, e.g., may stop allowing current to flow after the period of time. As described above, when the voltage level of the first node ND11 is discharged to be less than or equal to the half ($\frac{1}{2}$*VDD) of the power supply voltage VDD, the NMOS transistor N2 may be turned off. When the NMOS transistor N2 is turned off, because the path for the electrical connection between the second node ND12 and the ground voltage VSS is open, the voltage level of the second node ND12 may not drop. When the voltage level of the first node ND11 is discharged to be less than or equal to the half ($\frac{1}{2}$*VDD) of the power supply voltage VDD, the PMOS transistor P2 may be turned on, e.g., may allow current to flow. When the PMOS transistor P2 is turned on, the second node ND12 and the power supply voltage VDD are electrically coupled to each other, and thus, the voltage level of the second node ND12 may increase.

Figure 3:
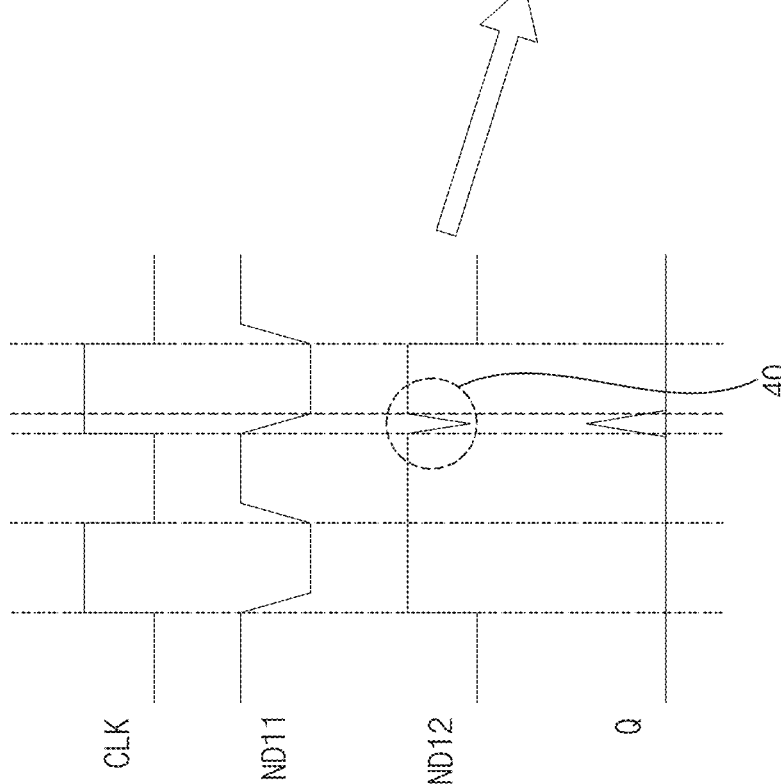
FIG. 3 is a timing diagram illustrating a glitch generation of a TSPC flip-flop.

FIG. 3 is a timing diagram illustrating a glitch generation of a TSPC flip-flop.

Referring to FIGS. 2 and 3, at a point in time t1, the clock signal CLK may be transited to, e.g., may toggle to "logic high" from "logic low". A period of time, in which the clock signal CLK remains "logic low" before the point in time t1, may correspond to a precharge period of time. For example, the first node ND11 may be connected to the power supply voltage VDD by the PMOS transistor P1, which is turned on, and the voltage level of the first node ND11 may be precharged to the power supply voltage VDD. The first node ND11 may not be grounded by the NMOS transistor N1 that is turned on, and the precharged voltage level of the first node ND11 may be maintained to the power supply voltage VDD. At the point in time t1, the first node ND11 may start being discharged from the point in time when the clock signal CLK is transited.

In a time interval from t1 to t2, the voltage level of the first node ND11 may remain greater than the half ($\frac{1}{2}$*VDD) of the power supply voltage VDD. For example, although the voltage of the first node ND11 starts dropping from the point in time t1, the voltage level of the first node ND11 may not be discharged to "logic low" without a delay time. Therefore, in the time interval from t1 to t2, the PMOS transistor P2 may keep or maintain being off according to a discharge delay of the first node ND11, and the NMOS transistor N2 may keep or remain being on. Because the clock signal CLK also remains "logic high" in the time interval from t1 to t2, the second node ND12 may be electrically connected to the ground voltage VSS through the discharge path including the NMOS transistor N4 and the NMOS transistor N2. Therefore, in the period of time from t1 to t2, the voltage of the second node ND12 may drop.

In a time interval from t2 to t3, the voltage level of the first node ND11 may be maintained to a voltage level lower than the half ($\frac{1}{2}$*VDD) of the power supply voltage VDD. According to various implementations, a gradient of the voltage drop in the time interval from t1 to t2 may be identical to that of the voltage drop in the time interval from t2 to t3. When the voltage level of the first node ND11 becomes lower than/less than half ($\frac{1}{2}$*VDD) of the power supply voltage VDD, the PMOS transistor P2 may be turned on, and the NMOS transistor N2 may be turned off. For example, because the NMOS transistor N2 is turned off in the discharge path generated in the time interval from t1 to t2, the second node ND12 may not be electrically coupled to the ground voltage VSS. Additionally or alternatively, at the same time, the PMOS transistor P2 is turned on, and thus, the second node ND12 may be electrically coupled to the power supply voltage VDD. Therefore, the voltage level of the second node ND12 having dropped in the time interval from t1 to t2 may be recharged and thus increased. Because an output signal Q is a signal generated by inverting a voltage level of the second node ND12 through the inverter 30, a peak signal having a uniform size in a time interval from t1 to t3, that is, a glitch, may be generated.

To restrict the glitch generation, a length of the time interval from t1 to t3 may have to be reduced. For example, when a length of a time interval reaching the half of the power supply voltage VDD is reduced by quickly discharging the first node ND11 in the time interval from t1 to t2, and/or when the length of a time interval is reduced until the second node ND12 is quickly discharged and charged to the power supply voltage the time period from t2 to t3, the glitch generation may be restricted or reduced in likelihood of occurrence and/or reduced in impact from occurring.

Figure 4:
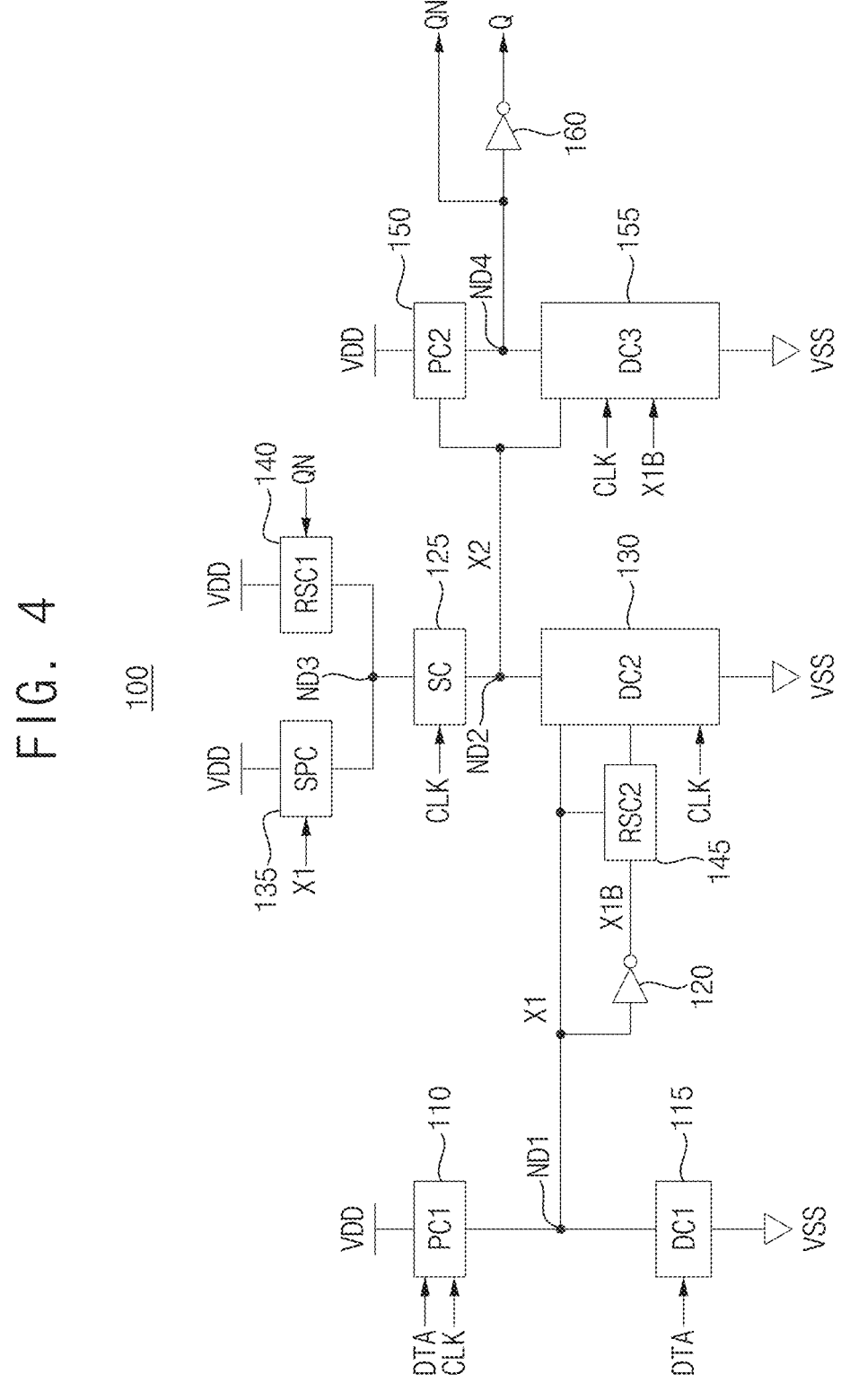
FIG. 4 is a block diagram illustrating an example of a flip-flop according to some implementations.

FIG. 4 is a block diagram illustrating an example of a flip-flop according to some implementations.

Referring to FIG. 4, a flip-flop 100 includes a first precharge circuit PC1 110, a first discharge circuit DC1 115, a switching circuit SC 125, a second discharge circuit DC2 130, a second precharge circuit PC2 150, a third discharge circuit DC3 155, a first inverter 120, a second inverter 160, a switching prevention circuit SPC 135, a first retention strengthening circuit RSC1 140 and a second retention strengthening circuit RSC2 145.

The first prechrage circuit 110 may be connected between a power supply voltage VDD and a first node ND1, and may selectively charge the first node ND1 based on a data input signal DTA and a clock signal CLK.

The first discharge circuit 115 may be connected between the first node ND1 and a ground voltage VSS, and may selectively discharge the first node ND1 based on the data input signal DTA. The first inverter 120 may output a first inverted signal X1B by inverting a first signal X1 of the first node ND1.

The switching circuit 125 may receive the clock signal CLK and may selectively connect a second node ND2 and a third node ND3 based on the clock signal CLK.

The second discharge circuit 130 may be connected between the second node ND2 and the ground voltage VSS, and may selectively discharge the second node ND2 based on the clock signal CLK.

The switching prevention circuit 135 may be connected between the power supply voltage VDD and the third node ND3, and may prevent a switching of a voltage level of the second node ND2 based on the first signal X1. The switching of the voltage level of the second node ND2 may occur due to a toggling of the clock signal CLK.

The first retention strengthening circuit 140 may be connected between the power supply voltage VDD and the third node ND3 in parallel with the switching prevention circuit 135 and may maintain a logic level of a second signal X2 of the second node ND2 based on an inverted output signal QN.

The second retention strengthening circuit 145 may be connected between the first node ND1 and the second discharge circuit 130 and may maintain a logic level of the first node ND1 (e.g., a logic level of the first signal X1) based on the first inverted signal X1B.

The second precharge circuit 150 may be connected between the power supply voltage VDD and a fourth node ND4, and may selectively charge the fourth node ND2 based on the second signal X2 of the second node ND2.

The third discharge circuit 155 may be connected between the fourth node ND4 and the ground voltage VSS, may selectively discharge the fourth node ND4 based on the clock signal CLK, the first inverted signal X1B and the second signal X2 of the second node ND2, and may prevent a glitch occurring at the fourth node ND4.

The second inverter 160 may provide an output signal Q by inverting the inverted output signal QN at the fourth node ND4.

Therefore, the flip-flop 100 may reduce power consumption because the switching prevention circuit 135 prevents a switching of a voltage level of the second node ND2, which is generated due to toggling of the clock signal CLK, based on the first signal X1. In addition, the flip-flop 100 may enhance performance because the first retention strengthening circuit 140 maintains a logic level of the second node ND2 and the second retention strengthening circuit 145 maintains a logic level of the first node ND1.

Hereinafter, a term of "connected" may mean "electrically connected" and a term of "coupled" may mean "electrically coupled."

Figure 5:
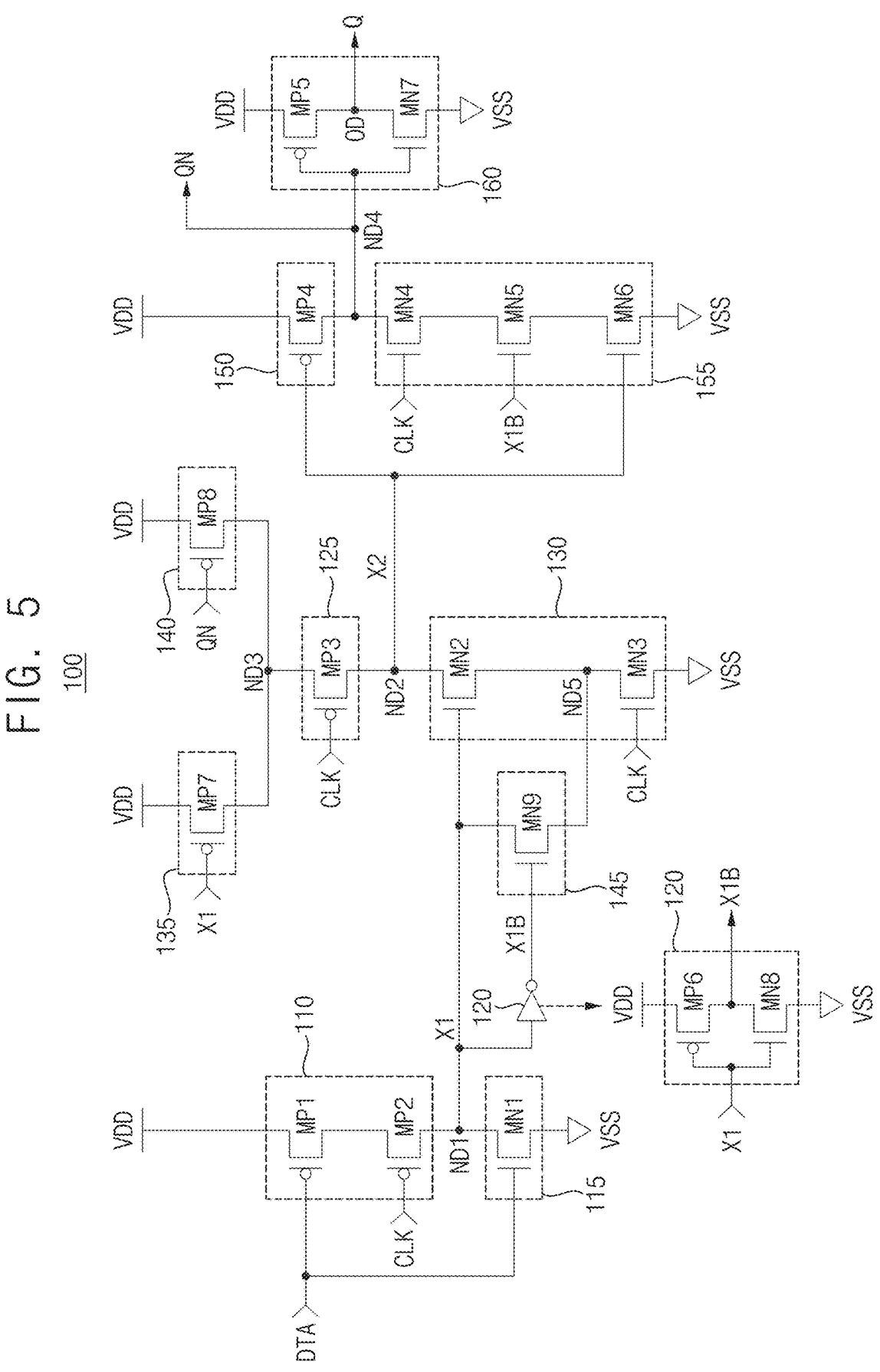
FIG. 5 is a circuit diagram illustrating a configuration of a flip-flop of FIG. 4 according to some implementations.

FIG. 5 is a circuit diagram illustrating a configuration of a flip-flop of FIG. 4 according to some implementations.

Referring to FIG. 5, the precharge circuit 110 includes p-channel metal-oxide semiconductor (PMOS) transistors MP1 and MP2 connected in series between the power supply voltage VDD and the first node ND1. The first discharge circuit 115 includes a n-channel metal-oxide semiconductor (NMOS) transistor MN1 connected between the first node ND1 and the ground voltage VSS.

The PMOS transistor MP1 may include a source coupled to the power supply voltage VDD, a drain coupled to the PMOS transistor MP2 and a gate to receive the data input signal DTA. The PMOS transistor MP2 may include a source coupled to the PMOS transistor MP1, a drain coupled to the first node ND1 and a gate to receive the clock signal CLK.

The NMOS transistor MN1 may include a drain coupled to the first node ND1, a source coupled to the ground voltage VSS and a gate to receive the data input signal DTA.

The PMOS transistor MP1 is turned on and the NMOS transistor MN1 is turned off, based on the data input signal DTA having a logic low level. Therefore, the PMOS transistor MP2 is repeatedly turned on and turned off according to toggling of the clock signal CLK, and thus, the first node ND1 is charged with a voltage level of the power supply voltage VDD. The PMOS transistor MP1 is turned off and the NMOS transistor MN1 is turned on, based on the data input signal DTA having a logic high level, and thus, first node ND1 is discharged to a voltage level of the ground voltage VSS.

The first inverter 120 includes a PMOS transistor MP6 and an NMOS transistor MN8 connected in series between the power supply voltage VDD and the ground voltage VSS. Gates of the PMOS transistor MP6 and the NMOS transistor MN8 are commonly coupled to the first node ND1, and receive the first signal X1. Drains of the PMOS transistor MP6 and the NMOS transistor MN8 are coupled to each other and provide the first inverted signal X1B.

The switching circuit 125 includes a PMOS transistor MP3 that includes a source coupled to the third node ND3, a drain coupled to the second node ND2 and a gate to receive the clock signal CLK. The PMOS transistor MP3 may connect the second node ND2 and the third node ND3 or may separate (e.g., disconnect) the second node ND2 from the third node ND3 based on toggling of the clock signal CLK.

The second discharge circuit 130 includes NMOS transistors MN2 and MN3 that are connected in series between the second node ND2 and the ground voltage VSS.

The NMOS transistors MN2 may be connected between the second node ND2 and a fifth node ND5, and may include a gate to receive the first signal X1. The NMOS transistors MN3 may be connected between the fifth node ND5 and the ground voltage VSS, and may include a gate to receive the clock signal CLK.

The NMOS transistor MN2 is turned on in response to the first signal X1 having a logic high level, the NMOS transistor MN3 is turned on in response to the clock signal CLK having a logic high level and the NMOS transistors MN2 and MN3 may discharge the second node ND2.

The switching prevention circuit 135 includes a PMOS transistor MP7 that includes a source coupled to the power supply voltage VDD, a drain coupled to the third node ND3 and a gate to receive the first signal X1. The PMOS transistor MP7 may be turned off in response to (e.g., based on) the first signal X1 having a logic high level and may prevent switching of the voltage level of the second node ND2, which is generated due to toggling of the clock signal CLK, by blocking a current path from the power supply voltage VDD to second node ND2 through the third node ND3.

The first retention strengthening circuit 140 includes a PMOS transistor MP8 that includes a source coupled to the power supply voltage VDD, a drain coupled to the third node ND3 and a gate to receive the inverted output signal QN. The PMOS transistor MP8 may be turned on in response to the inverted output signal QN having a logic low level and may maintain a logic level of the second node ND2 by providing a current to the second node ND2 through the third node ND3 when the clock signal CLK has a logic high level.

The second precharge circuit 150 includes a PMOS transistor MP4 that includes a source coupled to the power supply voltage VDD, a drain coupled to the fourth node ND4 and a gate coupled to the second node ND2. That is, the PMOS transistor MP4 has a gate to receive the second signal X2. The PMOS transistor MP4 may selectively charge the fourth node ND4 based on a logic level of the second signal X2.

The third discharge circuit 155 includes NMOS transistors MN4, MN5 and MN6 connected in series between the fourth node ND4 and the ground voltage VSS.

The NMOS transistor MN4 may be connected between the fourth node ND4 and the NMOS transistor MN5 (e.g., a drain of the NMOS transistor MN5) and may include a gate to receive the clock signal CLK. The NMOS transistor MN5 may be connected between the NMOS transistor MN4 (e.g., a source of the NMOS transistor MN4) and the NMOS transistor MN6 (e.g., a drain of the NMOS transistor MN6) and may have a gate to receive the first inverted signal X1B. The NMOS transistor MN6 may be connected between the NMOS transistor MN5 (e.g., a source of the NMOS transistor MN5) and the ground voltage VSS and may have a gate coupled to the second node ND2.

When the clock signal CLK has a logic high level, the second signal X2 of the second node ND2 has a logic high level and the first inverted signal X1B has a logic high level, the NMOS transistors MN4, MN5 and MN6 may be turned on and may discharge the fourth node ND4.

When the clock signal CLK has a logic high level, the second signal X2 of the second node ND2 has a logic high level and the first inverted signal X1B has a logic low level, the NMOS transistor MN5 may be turned off and may prevent a glitch occurring in the inverted output signal QN at the fourth node ND4 by cutting off a current path between the fourth node ND4 and the ground voltage VSS.

The second inverter 160 includes a PMOS transistor MP5 and an NMOS transistor MN7 connected in series between the power supply voltage VDD and the ground voltage VSS. Gates of the PMOS transistor MP5 and the NMOS transistor MN7 are commonly coupled to the fourth node ND4, and receive the inverted output signal QN. Drains of the PMOS transistor MP7 and the NMOS transistor MN7 are coupled to each other and provide the output signal Q. The second inverter 160 may provide the output signal Q at an output node OD by inverting the inverted output signal QN.

The second retention strengthening circuit 145 includes an NMOS transistor MN9 that includes a drain coupled to the first node ND1, a source coupled to the fifth node ND5 and a gate to receive the first inverted signal X1B. The NMOS transistor MN9 may be turned on in response to the first inverted signal X1B having a logic high level and may maintain a logic level of the first node ND1 with a logic low level.

FIG. 6 illustrates an example operation of the switching prevention circuit in the flip-flop of FIG. 5 according to some implementations.

Figure 7:
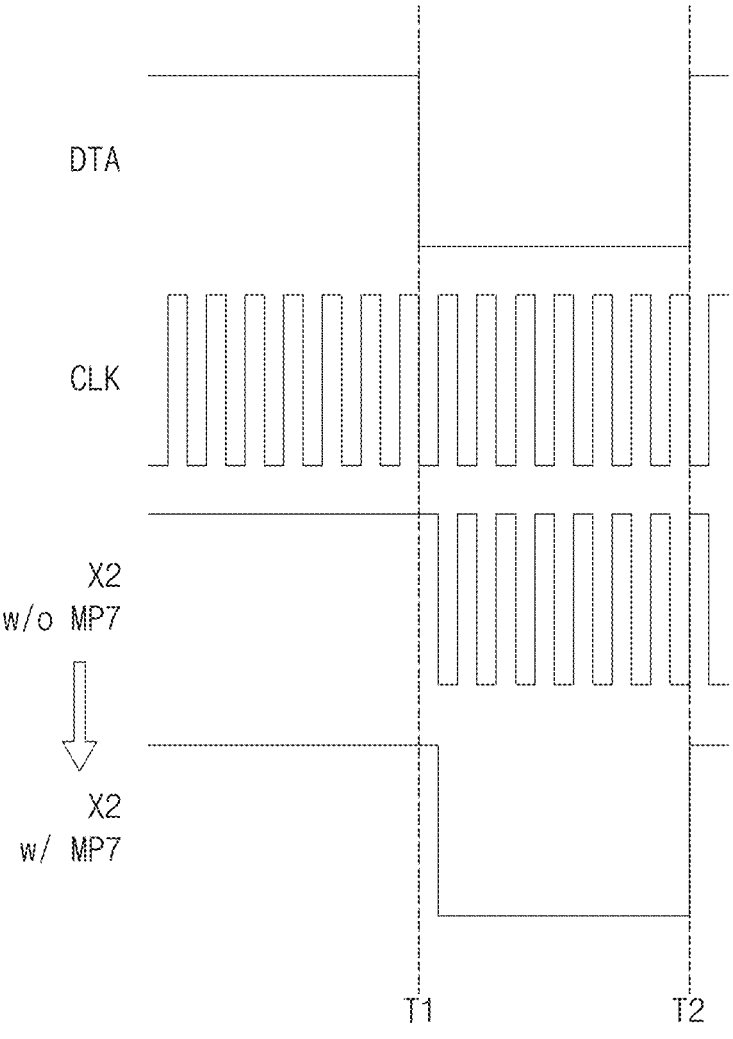
FIG. 7 is a timing diagram illustrating an operation of the switching prevention circuit in FIG. 6.

FIG. 7 is a timing diagram illustrating an operation of the switching prevention circuit in FIG. 6.

Hereinafter, assume that '0' represents a logic low level and '1' denotes a logic high level.

Referring to FIGS. 5 through 7, when the data input signal DTA has a logic low level, the PMOS transistor MP1 is turned on and the NMOS transistor MN1 is turned off. As the clock signal CLK toggles, the first signal X1 at the first node ND1 becomes a logic high level. The PMOS transistor MP7 is turned off in response to the first signal X1 having a logic high level and blocks a current path PTH1 from the power supply voltage VDD to the third node ND3 through the PMOS transistor MP3. Therefore, when the PMOS transistor MP3 is repeatedly turned on and turned off as the clock signal toggles, a voltage level of the second node ND2 (e.g., a voltage level of the second signal X2) is maintained at a logic low level during a time interval between T1 and T2, which is represented by w/MP7.

When the source of the PMOS transistor MP3 is directly coupled to the power supply voltage VDD, a voltage level of the second node ND2 (e.g., a voltage level of the second signal X2) repeatedly switches between the power supply voltage VDD and the ground voltage VSS during a time interval from T1 to T2, which is represented by w/o MP7, and power consumption occurs continuously.

However, the flip-flop 100 includes the switching prevention circuit 135 including the PMOS transistor MP7 and the switching prevention circuit 135 may prevent a switching of a voltage level of the second node ND2, which occurs due to a toggling of the clock signal CLK.

Figure 8:
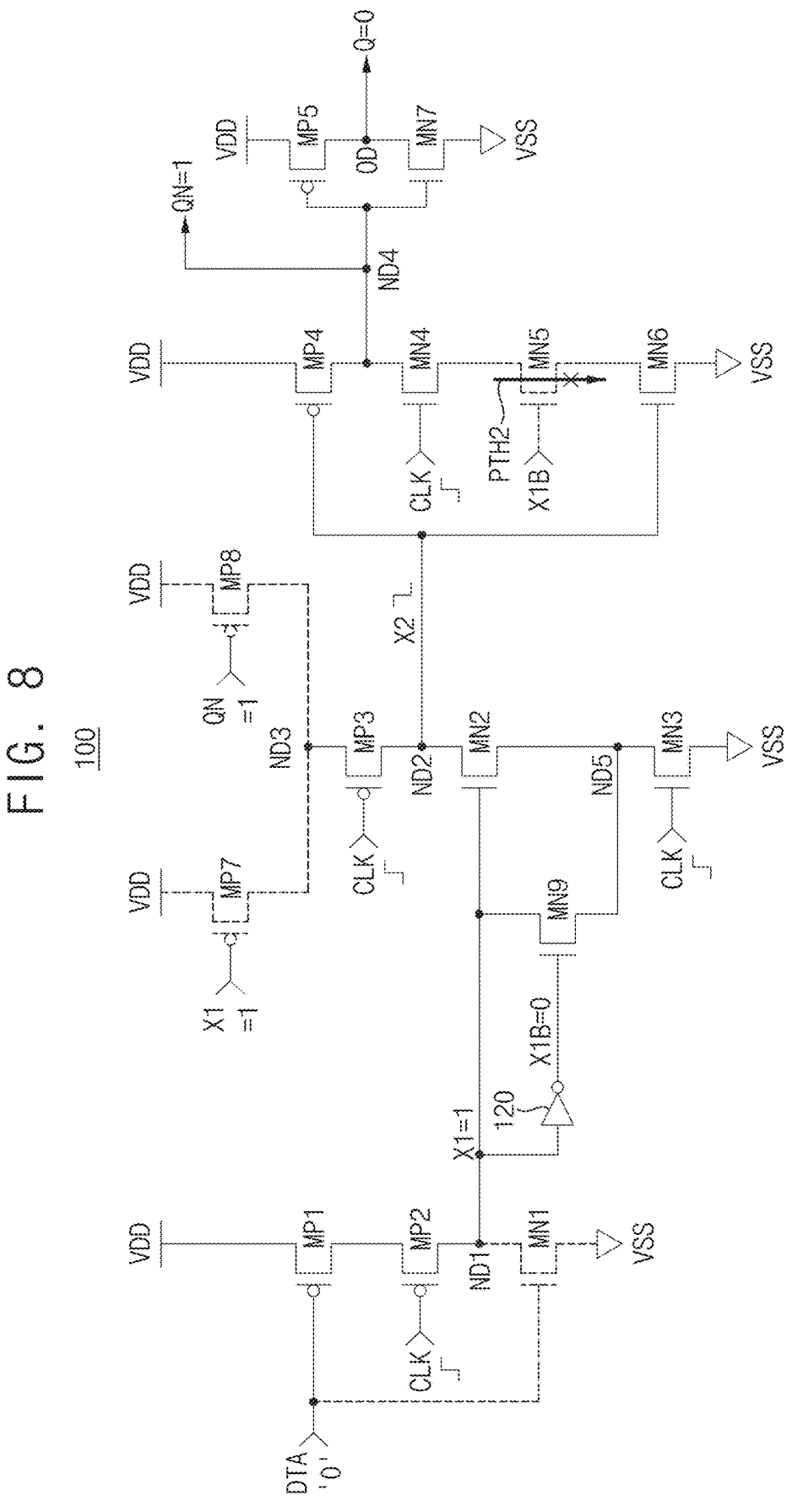
FIG. 8 illustrates an example operation of the third discharge circuit in the flip-flop of FIG. 5 according to some implementations.

FIG. 8 illustrates an example operation of the third discharge circuit in the flip-flop of FIG. 5 according to some implementations.

Figure 9:
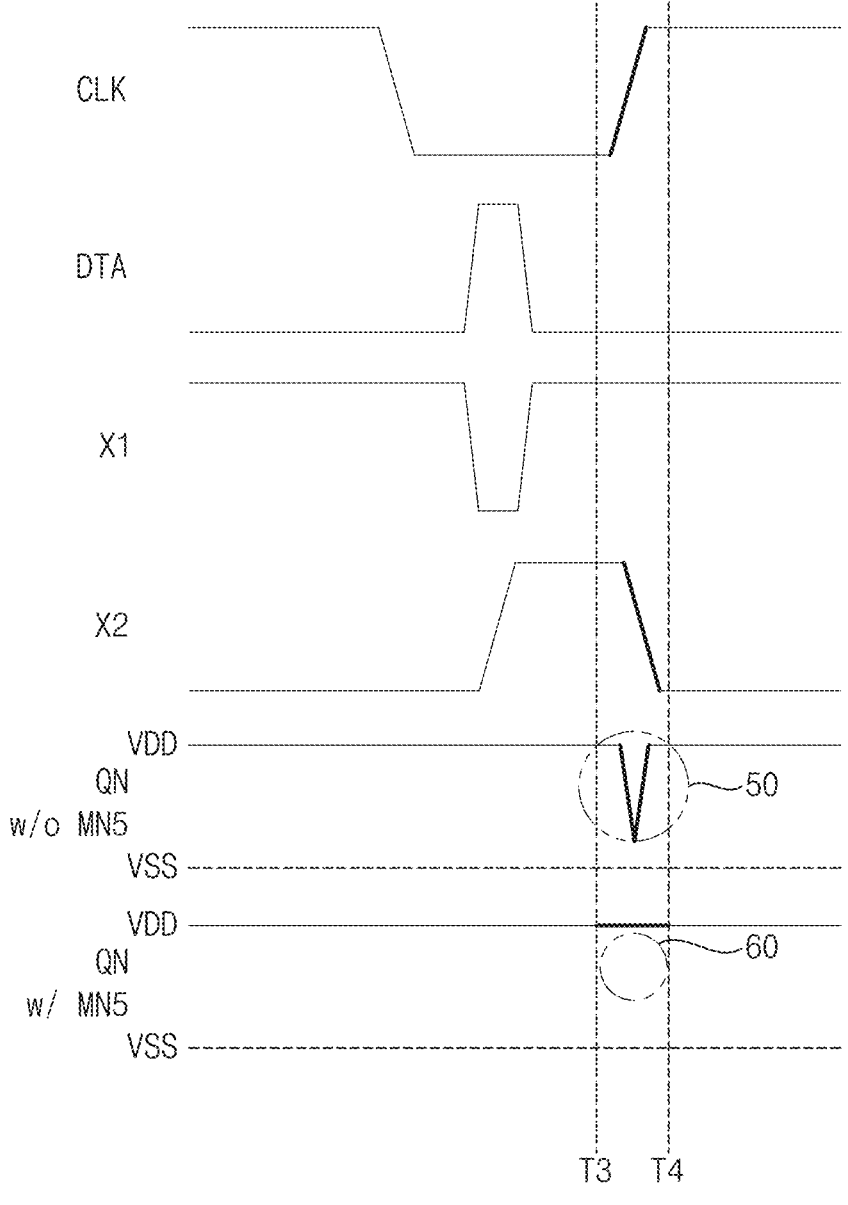
FIG. 9 is a timing diagram illustrating an operation of the third discharge circuit in FIG. 8.

FIG. 9 is a timing diagram illustrating an operation of the third discharge circuit in FIG. 8.

Referring to FIGS. 5, 8 and 9, when the data input signal DTA has a logic low level and the clock signal CLK transits upward from a logic low level to a logic high level, the NMOS transistor MN1 is turned off and the PMOS transistor MP2 is in on state and then is turned off. Therefore, the first signal X1 at the first node ND1 becomes a logic high level and the first inverted signal X1B, an output of the first inverter 120, becomes a logic low level.

The PMOS transistor MP7 is turned off in response to the first signal X1 having a logic high level and the NMOS transistor MN3 is turned off in response to the clock signal CLK transitioning upward, and thus the second signal X2 at the second node ND2 transits down ward from a logic high level to a logic low level. The PMOS transistor MP4 is turned on and the NMOS transistor MN6 is turned off in response to the second signal X2 transitioning downward, the inverted output signal QN at the fourth node ND4 becomes a logic high level. The NMOS transistor MN4 is turned on in response to the clock signal CLK transitioning upward while the NMOS transistor MN5 is turned off in response to the first inverted signal X1B having a logic low level, and thus the NMOS transistor MN5 may block a current path PTH2 between the fourth node ND4 and the ground voltage VSS.

When the third discharge circuit 155 does not include the NMOS transistor MN5 as denoted by w/o MN5, a glitch denoted by a reference numeral 50 may occur at the fourth node ND4 during a time interval from T3 to T4, in response to the second signal X2 transitioning upward and the clock signal CLK transitioning downward.

However, the flip-flop 100 includes the discharge circuit 155 including the NMOS transistor MN5 as denoted by w/MN5 and the discharge circuit 155 may maintain a voltage level of the fourth node ND4 with the power supply voltage VDD and may prevent a glitch from occurring as a reference numeral 60 indicates even when the to the second signal X2 transits upward and the clock signal CLK transits downward.

Figure 10:
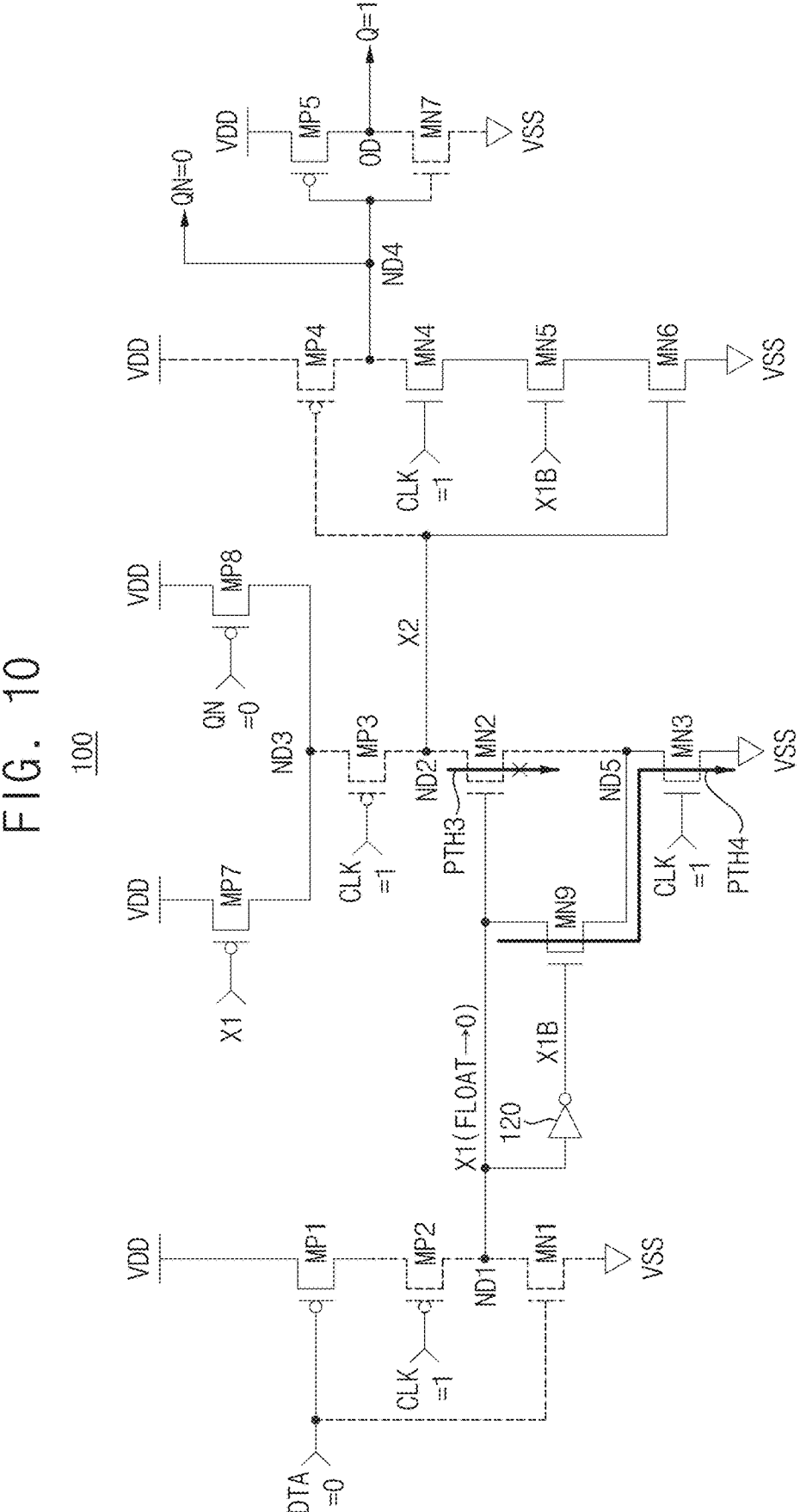
FIG. 10 illustrates an example operation of the second retention strengthening circuit in the flip-flop of FIG. 5 according to some implementations.

FIG. 10 illustrates an example operation of the second retention strengthening circuit in the flip-flop of FIG. 5 according to some implementations.

Referring to FIGS. 5 and 10, when the data input signal DTA has a logic low level and the clock signal CLK has a logic high level, the PMOS transistor MP1 is turned on, the NMOS transistor MN1 is turned off and the PMOS transistor MP2 is turned off, and thus, the first signal X1 becomes a logic low level from a floating state.

When the first signal X1 has a logic low level, the inverted first signal X1B has a logic high level, the NMOS transistor MN9 is turned on in response to the first signal X1B having a logic high level. Therefore, a current path PTH4 passing through the first node ND1, the NMOS transistor MN9 and the NMOS transistor MN3, and thus the second retention strengthening circuit 145 may maintain a voltage level of the first node ND1 with a logic low level.

In addition, the NMOS transistor MN2 is turned off in response to the first signal X1 having a logic low level and blocks a current path PTH3 between the second node ND2 and the fifth node ND5. Therefore, the second signal X2 at the second node ND2 becomes a logic high level. The PMOS transistor MP4 is turned off and the NMOS transistor MN6 is turned on in response to the second signal X2 having a logic high level, the NMOS transistor MN4 is turned on in response to the clock signal CLK having a logic high level, and the NMOS transistor MN5 is turned on in response to the first inverted signal X1B having a logic high level, and thus the fourth node ND4 is discharged to a voltage level of the ground voltage VSS. Therefore, the inverted output signal QN has a logic low level and the output signal Q has a logic high level.

In addition, the PMOS transistor MP7 is turned off in response to the first signal X1 having a logic high level and the PMOS transistor MP8 is turned on in response to the inverted output signal QN having a logic low level.

When the flip-flop 100 does not include the second retention strengthening circuit 145 including the NMOS transistor MN9, a voltage level of the first node ND1 may be flipped.

Figure 11:
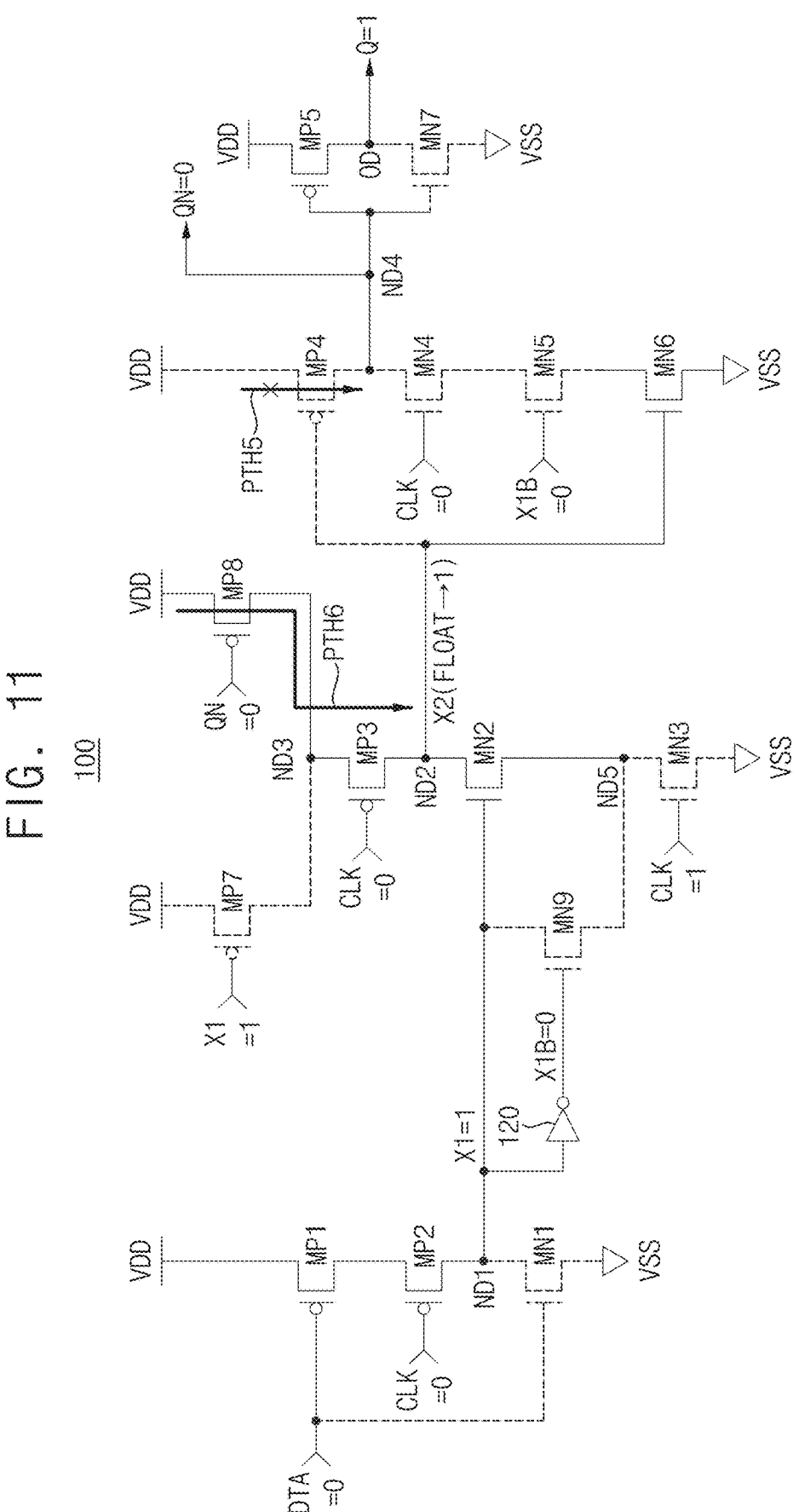
FIG. 11 illustrates an example operation of the first retention strengthening circuit in the flip-flop of FIG. 5 according to some implementations.

FIG. 11 illustrates an example operation of the first retention strengthening circuit in the flip-flop of FIG. 5 according to some implementations.

Referring to FIGS. 5 and 11, when the data input signal DTA has a logic low level and the clock signal CLK has a logic low level, the PMOS transistor MP1 is turned on, the NMOS transistor MN1 is turned off and the PMOS transistor MP2 is turned on, and thus, the first signal X1 becomes a logic high level.

The PMOS transistor MP7 is turned off in response to the first signal X1 having a logic high level and the PMOS transistor MP3 is turned on in response to the clock signal CLK having a logic low level, and thus, the second signal X2 becomes a logic high level from a floating state.

The PMOS transistor MP4 is turned off and the NMOS transistor MN6 is turned on in response to the second signal X2 having a logic high level, the NMOS transistor MN4 is turned on in response to the clock signal CLK having a logic high level, and the NMOS transistor MN5 is turned off in response to the first inverted signal X1B having a logic low level, and thus the inverted output signal QN at the fourth node ND4 is maintained with a logic low level.

Because the PMOS transistor MP8 is turned on in response to the inverted output signal QN having a logic low level, a current is provided to the second node ND2 through a current path PTH6 from the power supply voltage VDD, through the PMOS transistor MP8 and the PMOS transistor MP3 and to the second node ND2, and thus, the second retention strengthening circuit 140 may maintain a voltage level at the second node ND2 with a logic high level.

Therefore, the flip-flop 100 according to some implementations, may reduce power consumption due to toggling of the clock signal CLK by reducing a number of the transistors MP2, MP3, MN3 and MN4 that receive the clock signal CLK and by including the switching prevention circuit 125, may increase retention time of logic levels of the nodes (e.g., internal nodes) ND1 and ND2 to enhance performance and to applicable frequency range by including the first retention strengthening circuit 140 and the second retention strengthening circuit 145 and may prevent a glitch from occurring at the fourth node ND4 by including the third discharge circuit 155 that includes the NMOS transistor MN5 having a gate to receive the first inverted signal X1B.

Figure 12A:
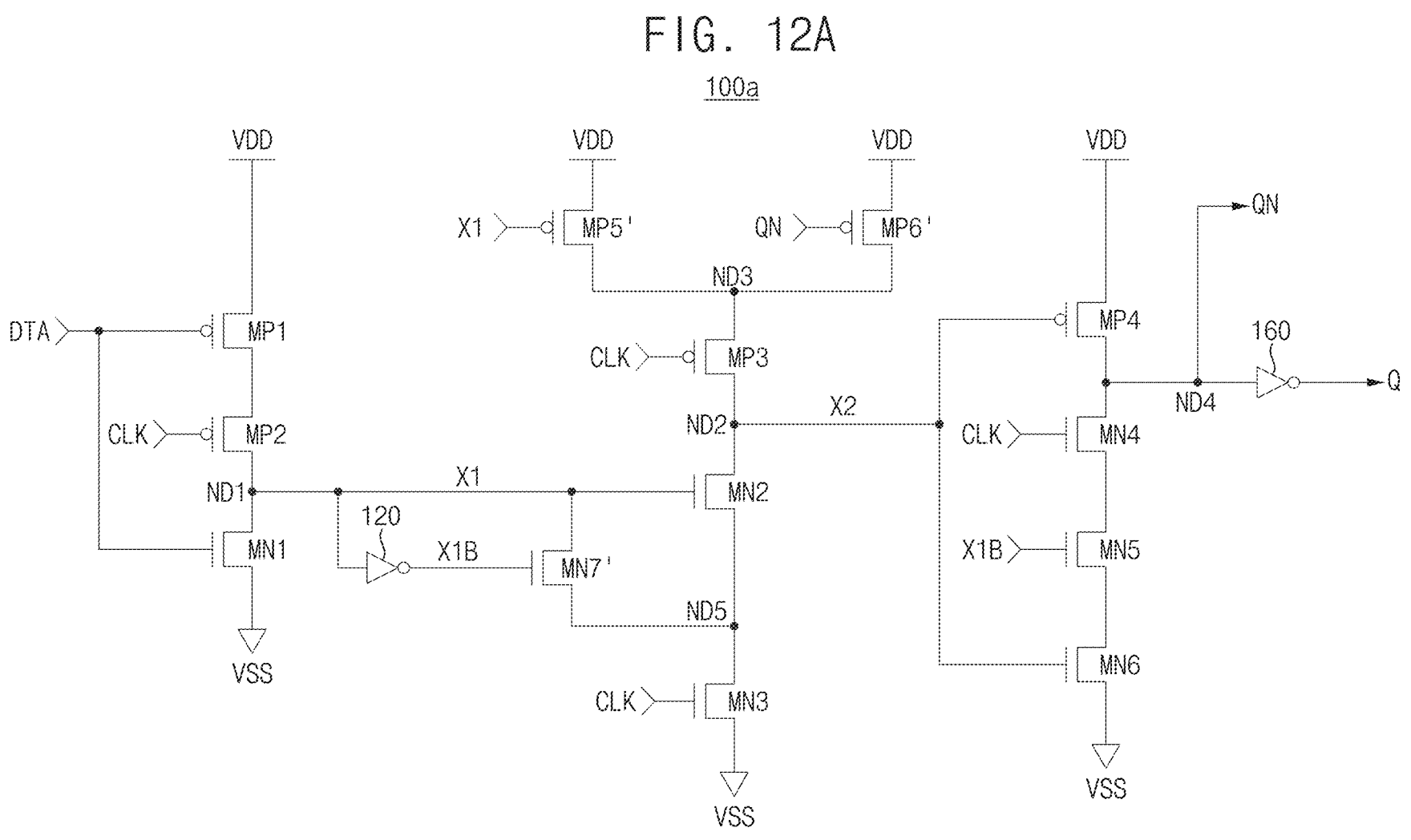

FIG. 12A is a circuit diagram illustrating an example of a flip-flop according to some implementations.

Referring to FIG. 12A, a flip-flop 100a according to some implementations includes first through sixth PMOS transistors MP1, MP2, MP3, MP4, MP5' and MP6', first through seventh NMOS transistors MN1, MN2, MN3, MN4, MN5, MN6 and MN7', a first inverter 120 and a second inverter 160.

The first PMOS transistor MP1 may include a source coupled to the power supply voltage VDD, a drain coupled to a source of the PMOS transistor MP2 and a gate to receive the data input signal DTA. The second PMOS transistor MP2 may include a source coupled to the drain of the PMOS transistor MP1, a drain coupled to a first node ND1 and a gate to receive the clock signal CLK. The first NMOS transistor MN1 may include a drain coupled to the first node ND1, a source coupled to the ground voltage VSS and a gate to receive the data input signal DTA.

The first inverter 120 may output a first inverted signal X1B by inverting a first signal X1 at the first node ND1.

The third PMOS transistor MP3 may include a source coupled to a third node ND3, a drain coupled to a second node ND2 and a gate to receive the clock signal CLK. The second NMOS transistors MN2 may include a drain coupled to the second node ND2, a source coupled to a fifth node ND5 and a gate to receive the first signal X1. The third NMOS transistors MN3 may include a drain coupled to the fifth node ND5, a source coupled to the ground voltage VSS and a gate to receive the clock signal CLK.

The fourth PMOS transistor MP4 may include a source coupled to the power supply voltage VDD, a drain coupled to a fourth node ND4 (e.g., a drain of the fourth NMOS transistor MN4) and a gate to receive a second signal X2 at the second node ND2. The fourth NMOS transistor MN4 may include a drain coupled to the fourth node ND4 (e.g., the drain of the fourth PMOS transistor MP4), a source coupled to a drain of the fifth NMOS transistor MN5 and a gate to receive the clock signal CLK. The fifth NMOS transistor MN5 may include a drain coupled to the source of the fourth NMOS transistor MN4, a source coupled to a drain of the sixth NMOS transistor MN6 and a gate to receive the first inverted signal X1B. The sixth NMOS transistor MN6 may include a drain coupled to the source of the fifth NMOS transistor MN5 and a source coupled to the ground voltage VSS and a gate to receive the second signal X2.

The second inverter 160 may provide an output signal Q by inverting an inverted output signal QN at the fourth node ND4.

The fifth PMOS transistor MP5' may be connected between the power supply voltage VDD and the third node ND3, and may include a gate to receive the first signal X1. The sixth PMOS transistor MP6' may be connected between the power supply voltage VDD and the third node ND3 in parallel with the fifth PMOS transistor MP5', and may include a gate to receive the inverted output signal QN'. The seventh NMOS transistor MN7' may be connected between the first node ND1 and the fifth node ND5, and may include a gate to receive the first inverted signal X1B.

Figure 12B:
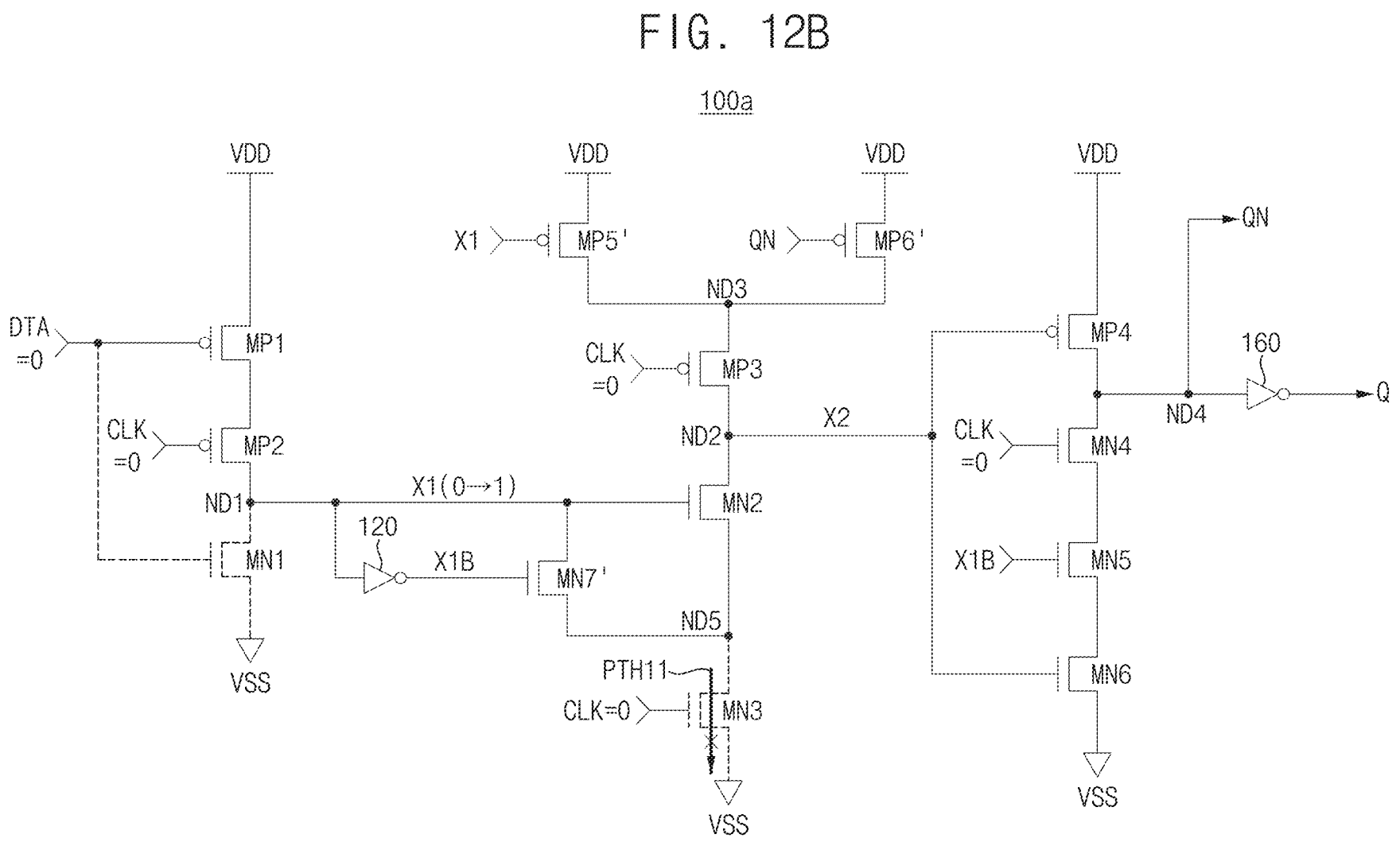
Figure 12C:
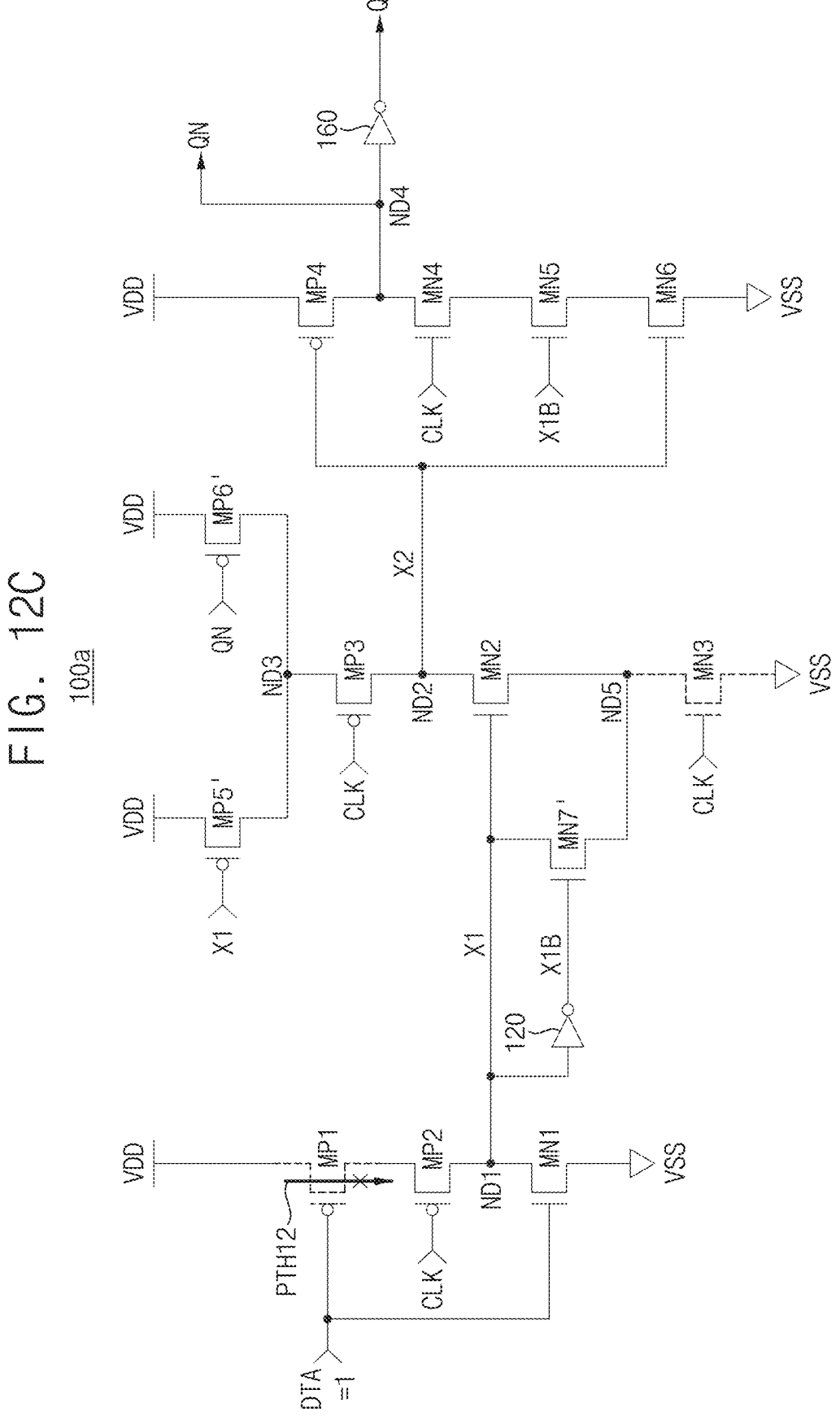

FIGS. 12B and 12C illustrate charging operation and discharging operation on the first node in the flip-flop of FIG. 12A, respectively.

Referring to FIG. 12B, when the data input signal DTA has a logic low level and the clock signal CLK has a logic low level, the first PMOS transistor MP1 and the second PMOS transistor MP2 are turned on, and thus, the first node ND1 is charged with a voltage level of the power supply voltage VDD. In this case, the third NMOS transistor MN3 is turned off in response to the clock signal CLK having a logic low level, and a discharging path PTH11 between the fifth node ND5 and the ground voltage VSS may be blocked.

Referring to FIG. 12C, when the data input signal DTA has a logic high level, the first NMOS transistor MN1 is turned on, and thus, the first node ND1 is discharged to a voltage level of the ground voltage VSS. In this case, the first PMOS transistor MP1 is turned off in response to the data input signal DTA having a logic high level, and a charging path PTH12 between the power supply voltage VDD and the second PMOS transistor MP2 may be blocked.

Figure 12D:
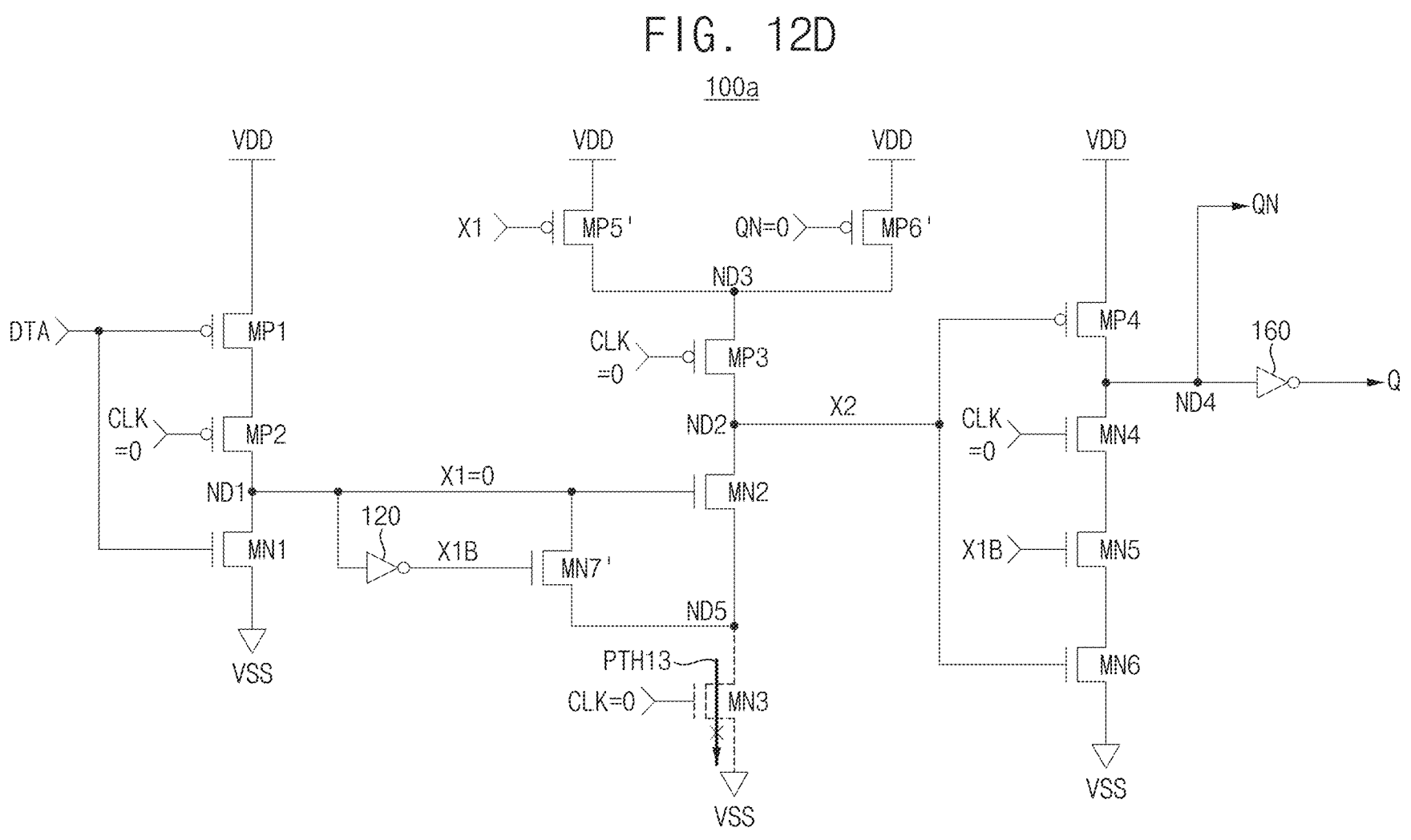
Figure 12E:
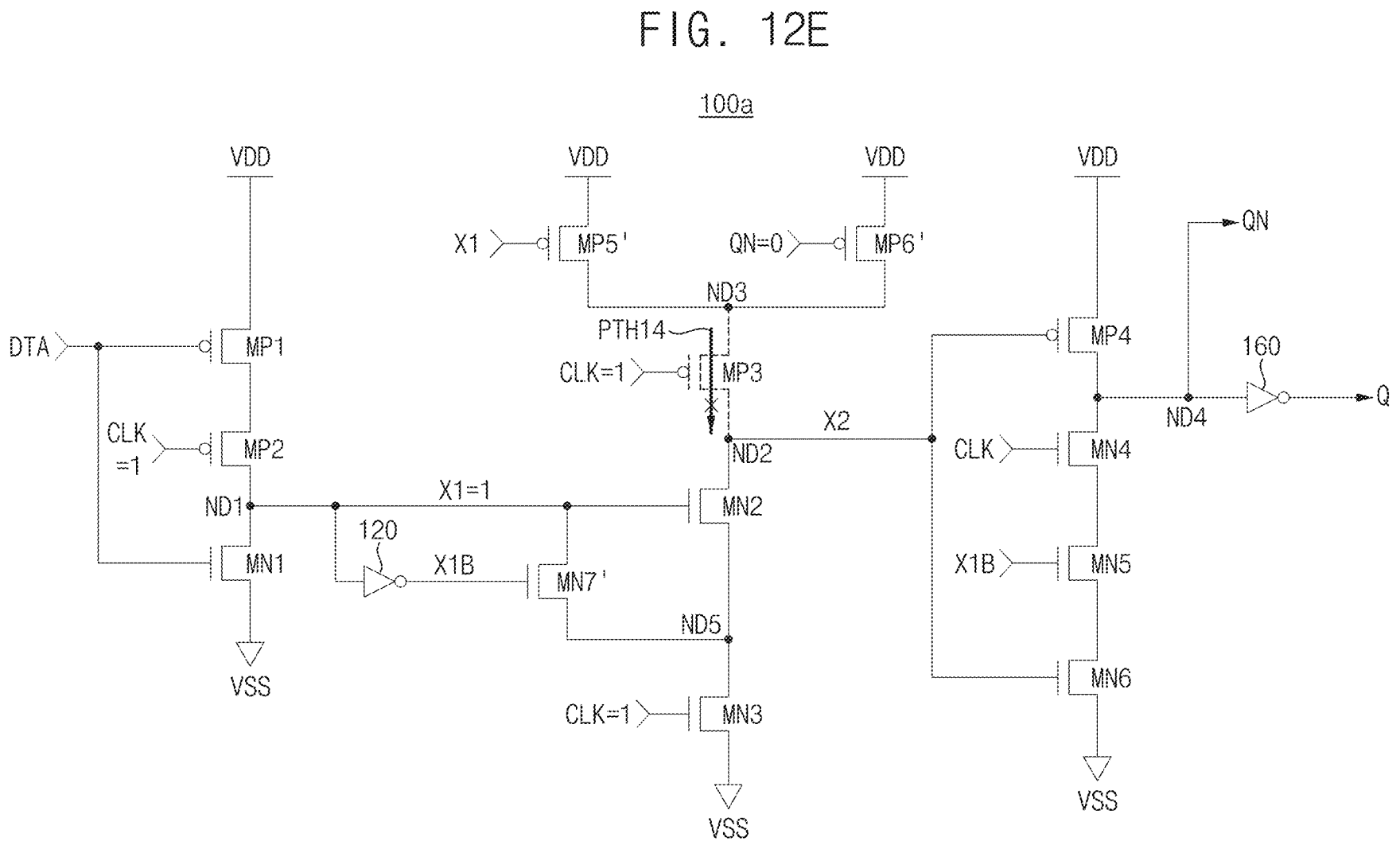

FIGS. 12D and 12E illustrate charging operation and discharging operation on the second node in the flip-flop of FIG. 12A, respectively.

Referring to FIG. 12D, when the clock signal CLK has a logic low level and the first signal X1 or the inverted output signal QN has a logic low level, the third PMOS transistor MP3 is turned on, the fifth PMOS transistor MP5' or the sixth PMOS transistor MP6' is turned on, and the second NMOS transistor MN2 is turned off, and thus the second node ND2 is charged with a voltage level of the power supply voltage VDD. In this case, the third NMOS transistor MN3 is turned off in response to the clock signal CLK having a logic low level, and a discharging path PTH13 between the fifth node ND5 and the ground voltage VSS may be blocked.

Referring to FIG. 12E, when the clock signal CLK has a logic high level and the first signal X1 has a logic high level, the second NMOS transistor MN3 and the third NMOS transistor are turned on, and thus, the second node ND2 is discharged to a voltage level of the ground voltage VSS. In this case, the third PMOS transistor MP3 is turned off in response to the clock signal CLK having a logic high level, and a charging path PTH14 between the third node ND3 and the second node ND2 may be blocked.

Figure 12F:
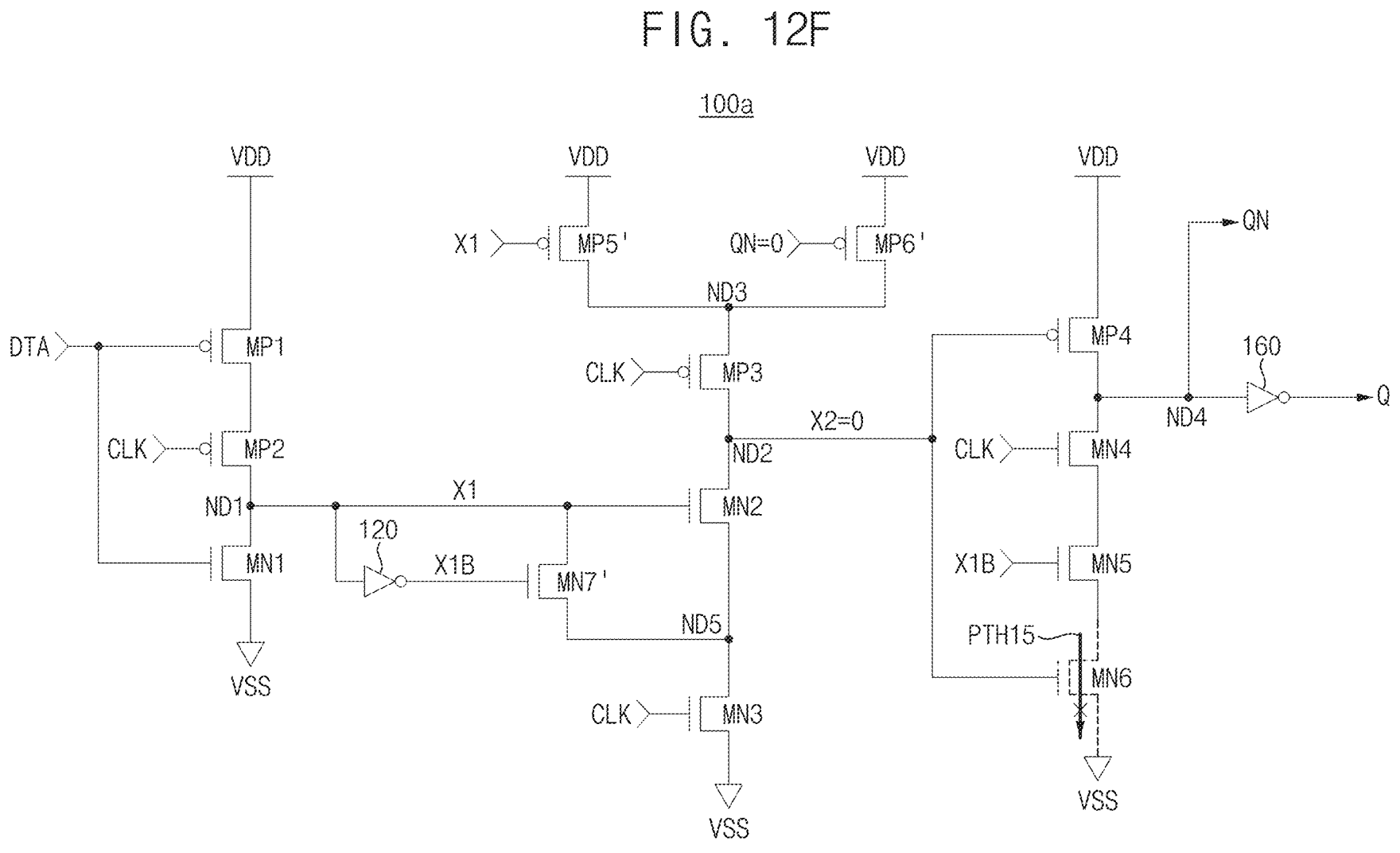
Figure 12G:
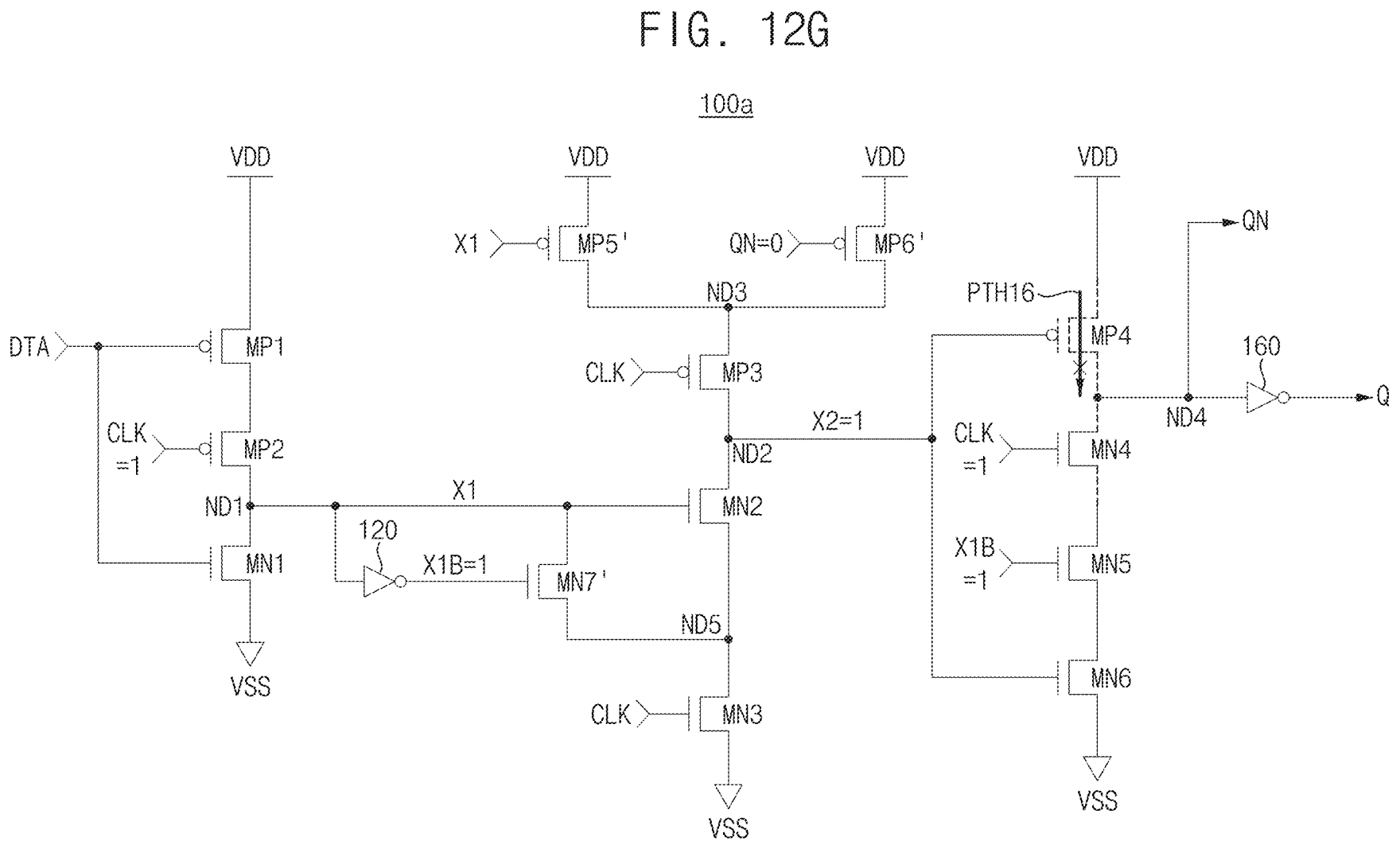

FIGS. 12F and 12G illustrate charging operation and discharging operation on the fourth node in the flip-flop of FIG. 12A, respectively.

Referring to FIG. 12F, when second signal X2 at the second node ND2 has a logic low level, the fourth PMOS transistor MP4 is turned on, and thus, the fourth node ND2 is charged with a voltage level of the power supply voltage VDD. In this case, the sixth NMOS transistor MN6 is turned off in response to the second signal X2 having a logic low level, and a discharging path PTH15 between the fifth NMOS transistor MN5 and the ground voltage VSS may be blocked.

Referring to FIG. 12G, when the second signal X2 at the second node ND2 has a logic high level, the clock signal CLK has a logic low level and the first inverted signal X1B has a logic high level, the fourth NMOS transistor MN4, the fifth NMOS transistor MN5 and the sixth NMOS transistor MN6 are turned on, and thus, the fourth node ND4 is discharged to a voltage level of the ground voltage VSS. In this case, the fourth PMOS transistor MP4 is turned off in response to the second signal X2 having a logic high level, and a charging path PTH16 between the power supply voltage VDD and the fourth node ND4 may be blocked.

Therefore, the flip-flop 100a may prevent contention by preventing a charging path and a discharging path from being conducted concurrently.

Figure 13A:
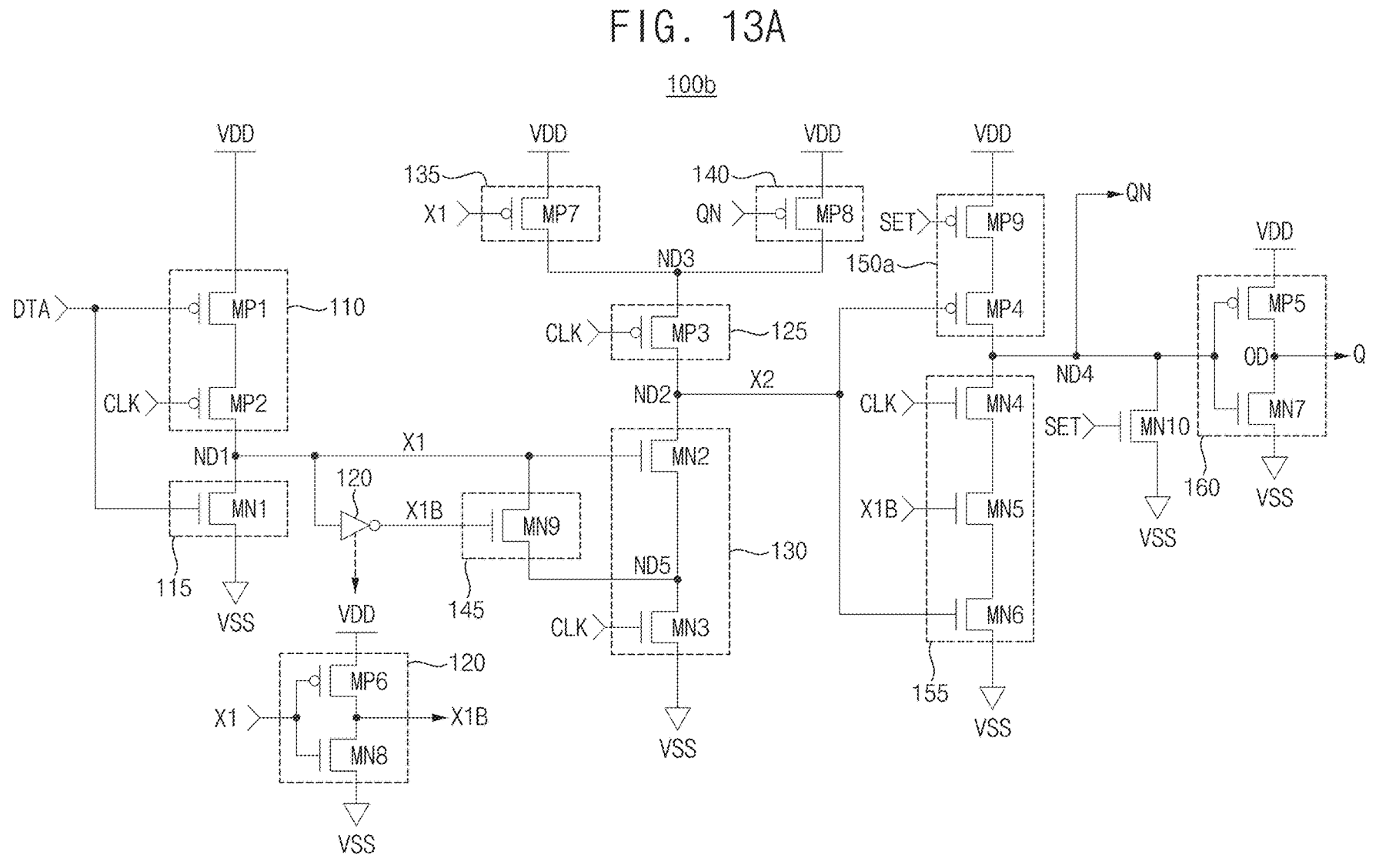

FIG. 13A is a circuit diagram illustrating an example of a flip-flop according to some implementations.

Referring to FIG. 13A, a flip-flop 100b includes a first prechrage circuit 110, a first discharge circuit 115, a switching circuit 125, a second discharge circuit 130, a second precharge circuit 150a, a third discharge circuit 155, a first inverter 120, a second inverter 160, a switching prevention circuit 135, a first retention strengthening circuit 140, a second retention strengthening circuit 145 and an NMOS transistor MN10.

The flip-flop 100b differs from the flip-flop 100 of FIG. 5 in a configuration of the second precharge circuit 150a and in that the flip-flop 100b further includes the NMOS transistor MN10, and thus descriptions repeated with FIG. 5 will be omitted.

Referring to FIG. 13A, the second precharge circuit 150a includes a PMOS transistor MP9 and a PMOS transistor MP4 that are connected in series between the power supply voltage VDD and the fourth node ND4. The PMOS transistor MP9 may be connected between the power supply voltage VDD and the PMOS transistor MP4 and may include a gate to receive a set signal SET. The PMOS transistor MP4 may be connected between the PMOS transistor MP4 and the fourth node ND4 and may include a gate to receive the second signal X2.

The NMOS transistor MN10 may be connected between the fourth node ND4 and may include a gate to receive the set signal SET.

When the set signal SET has a logic high level, the PMOS transistor MP4 is turned off and the NMOS transistor MN10 is turned on, and thus, the inverted output signal QN at the fourth node ND4 becomes a logic low level and the output signal Q becomes a logic high level.

When the set signal SET has a logic high level, the output signal Q may be set to a logic high level by the PMOS transistor MP4 and the NMOS transistor MN10.

Figure 13B:
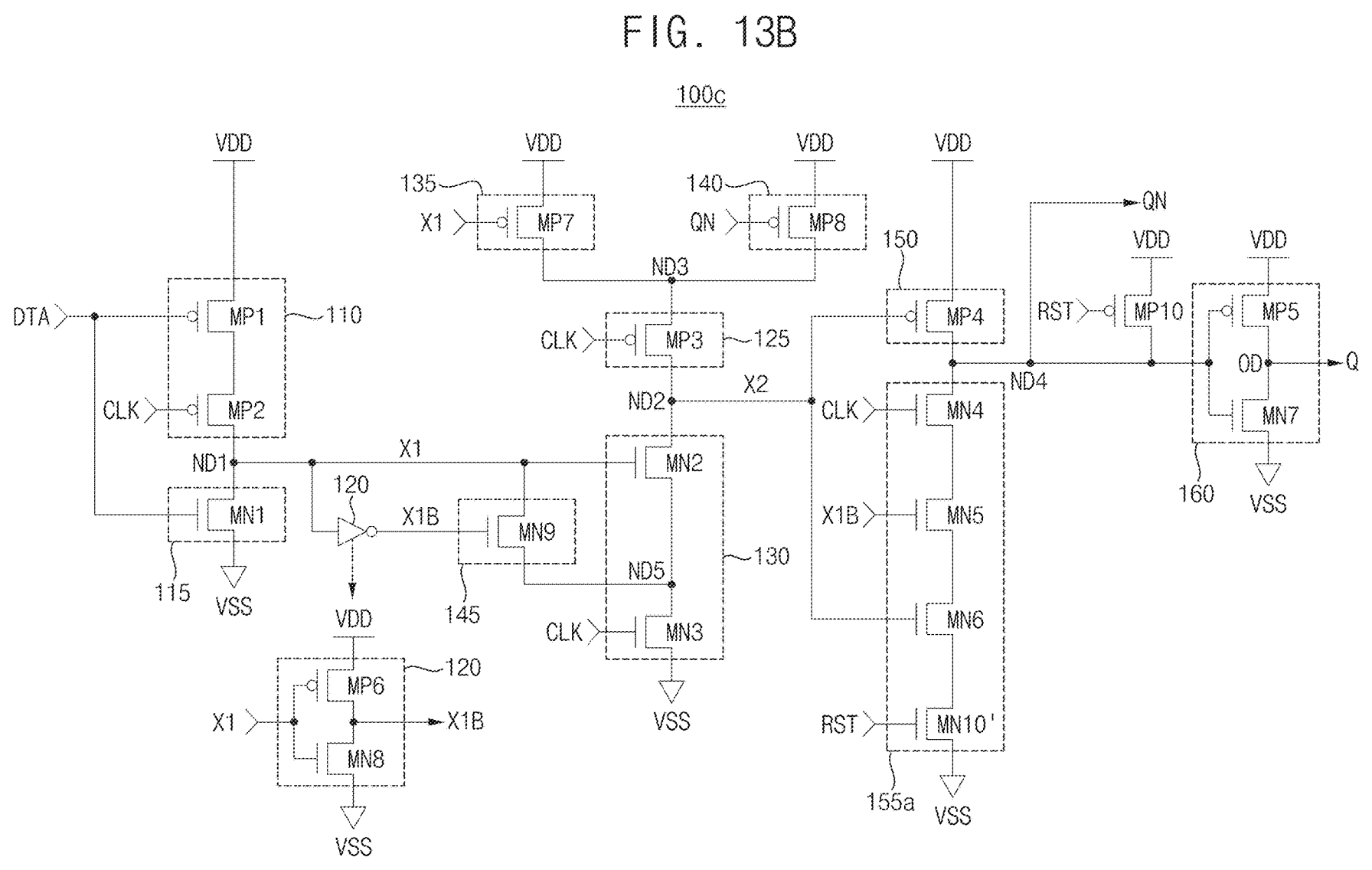

FIG. 13B is a circuit diagram illustrating an example of a flip-flop according to some implementations.

Referring to FIG. 13B, a flip-flop 100c includes a first prechrage circuit 110, a first discharge circuit 115, a switching circuit 125, a second discharge circuit 130, a second precharge circuit 150, a third discharge circuit 155a, a first inverter 120, a second inverter 160, a switching prevention circuit 135, a first retention strengthening circuit 140, a second retention strengthening circuit 145 and a PMOS transistor MP10.

The flip-flop 100c differs from the flip-flop 100 of FIG. 5 in a configuration of the third discharge circuit 155a and in that the flip-flop 100c further includes the PMOS transistor MP10, and thus descriptions repeated with FIG. 5 will be omitted.

Referring to FIG. 13B, the third discharge circuit 155a includes NMOS transistors MN4, MN5, MN6 and MN10' connected in series between the fourth node ND4 and the ground voltage VSS.

The NMOS transistor MN4 may be connected between the fourth node ND4 and the NMOS transistor MN5 and may include a gate to receive the clock signal CLK. The NMOS transistor MN5 may be connected between the NMOS transistor MN4 and the NMOS transistor MN6 and may have a gate to receive the first inverted signal X1B. The NMOS transistor MN6 may be connected between the NMOS transistor MN5 and the NMOS transistor MN10' and may have a gate coupled to the second node ND2. The NMOS transistor MN10' may be connected between the NMOS transistor MN6 and the ground voltage VSS and may include a gate to receive a reset signal RST.

The PMOS transistor MP10 may be connected between the power supply voltage VDD and the fourth node ND4 and may include a gate to receive the reset signal RST.

When the reset signal RST has a logic low level, the PMOS transistor MP10 is turned on and the NMOS transistor MN10' is turned off, and thus, the inverted output signal QN at the fourth node ND4 becomes a logic high level and the output signal Q becomes a logic low level.

When the reset signal RST has a logic low level, the output signal Q may be reset to a logic low level by the PMOS transistor MP10 and the NMOS transistor MN10'.

Figure 14:
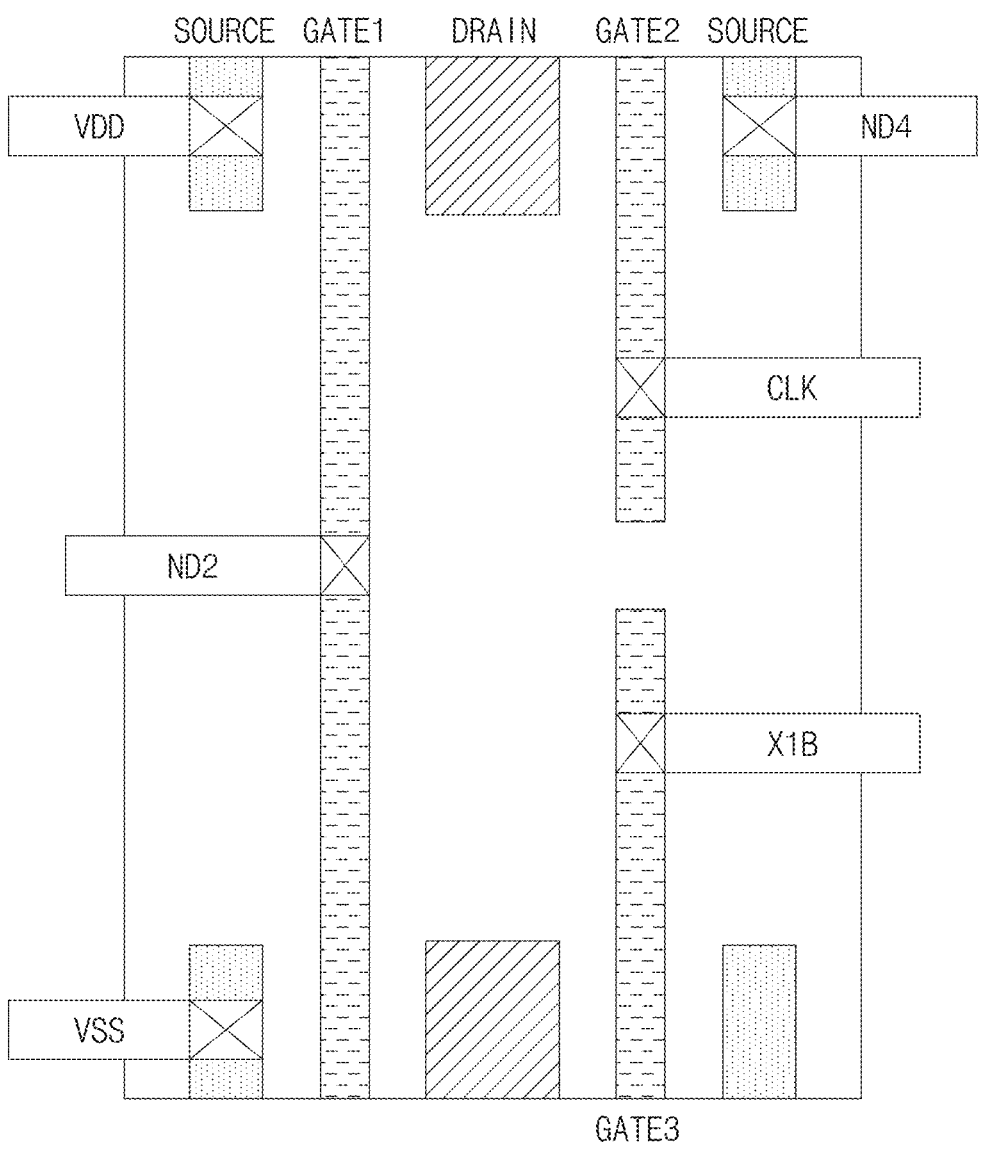
FIG. 14 illustrates a layout of a flip-flop according to some implementations.

FIG. 14 illustrates a layout of a flip-flop according to some implementations.

FIG. 14 may correspond to a layout of the second precharge circuit 150 and the third discharge circuit 150 in the flip-flop 100 of FIG. 5.

Referring to FIGS. 5 and 14, a source coupled to the power supply voltage VDD, a first gate pattern GATE1 and a drain may correspond to the PMOS transistor MP4, and a source coupled to the ground voltage VSS, the first gate pattern GATE1 and a drain may correspond to the NMOS transistor MN6. The first gate pattern GATE1 may be coupled to the second node ND2.

In addition, a source coupled to the fourth node ND4, a second gate pattern GATE2 and a drain may correspond to the NMOS transistor MN4, and the second gate pattern GATE2 may receive the clock signal CLK. A source, a third gate pattern GATE3 and a drain may correspond to the NMOS transistor MN5 and the third gate pattern GATE3 may receive the first inverted signal X1B.

Figure 15:
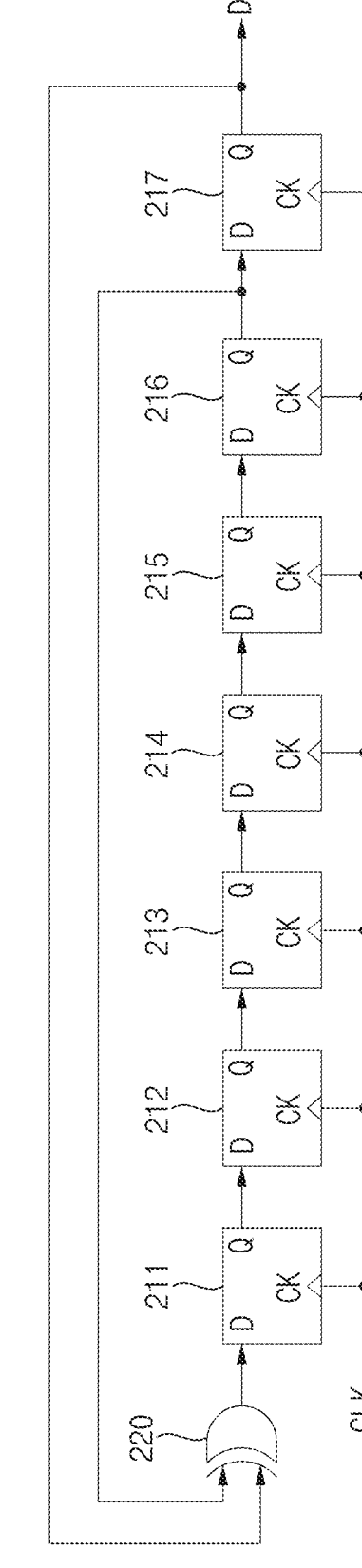
FIG. 15 is a block diagram illustrating a pseudo random binary sequence (PRBS) generator that generates a PRBS according to some implementations.

FIG. 15 is a block diagram illustrating a pseudo random binary sequence (PRBS) generator that generates a PRBS according to some implementations.

Referring to FIG. 15, a PRBS generator 200 includes a plurality of data flip-flops 211, 212, 213, 214, 215, 216 and 217 and an exclusive OR gate 220.

Each of the plurality of data flip-flops 211, 212, 213, 214, 215, 216 and 217 includes a data input terminal D, an output terminal Q and a clock terminal CK The plurality of data flip-flops 211, 212, 213, 214, 215, 216 and 217 may be cascaded-connected and may receive a clock signal CLK commonly through each clock terminal CK.

The exclusive OR gate 220 may perform an exclusive OR operation on outputs of the data flip-flop 216 and the data flip-flop 217 and may provide its output to the data input terminal of the data flip-flop 211. Therefore, the data flip-flop 217 may provide an output signal DOUT corresponding to a PBRS at the output terminal Q.

Figure 16:
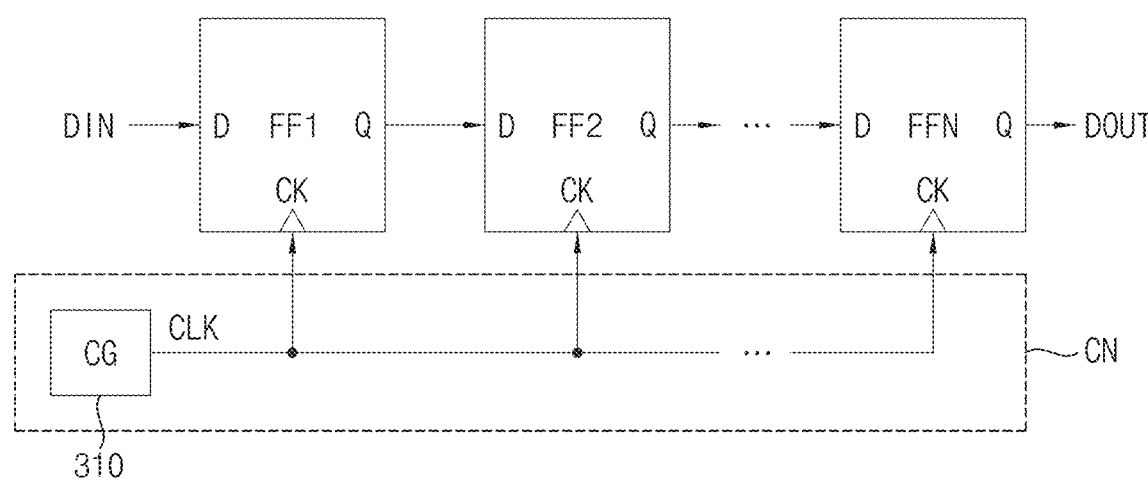
FIG. 16 is a diagram illustrating an example of an integrated circuit according to some implementations.

FIG. 16 is a diagram illustrating an example of an integrated circuit according to some implementations.

Referring to FIG. 16, an integrated circuit 300 includes a plurality of flip-flops FF1, FF2, . . . , FFN and a clock generator CG 310.

The clock generator 310 may generate a clock signal CLK and may deliver the clock signal CLK to the plurality of flip-flops FF1, FF2, . . . , FFN through a clock network CN. As mentioned above, the clock signal CLK may have a true single phase.

Each of the plurality of flip-flops FF1, FF2, . . . , FFN includes a data input terminal D, an output terminal Q and a clock terminal CK and the plurality of flip-flops FF1, FF2, . . . , FFN may be cascaded-connected. The flip-flops FF1, FF2, . . . , FFN may provide an output signal DOUT at the output terminal QN of the flip-flop FFN by sequentially delaying an input signal DIN applied to the input terminal D of the flip-flop FF in synchronization with the clock signal CLK.

Each of the plurality of flip-flops FF1, FF2, . . . , FFN may employ the flip-flop 100 of FIG. 5.

Figure 17:
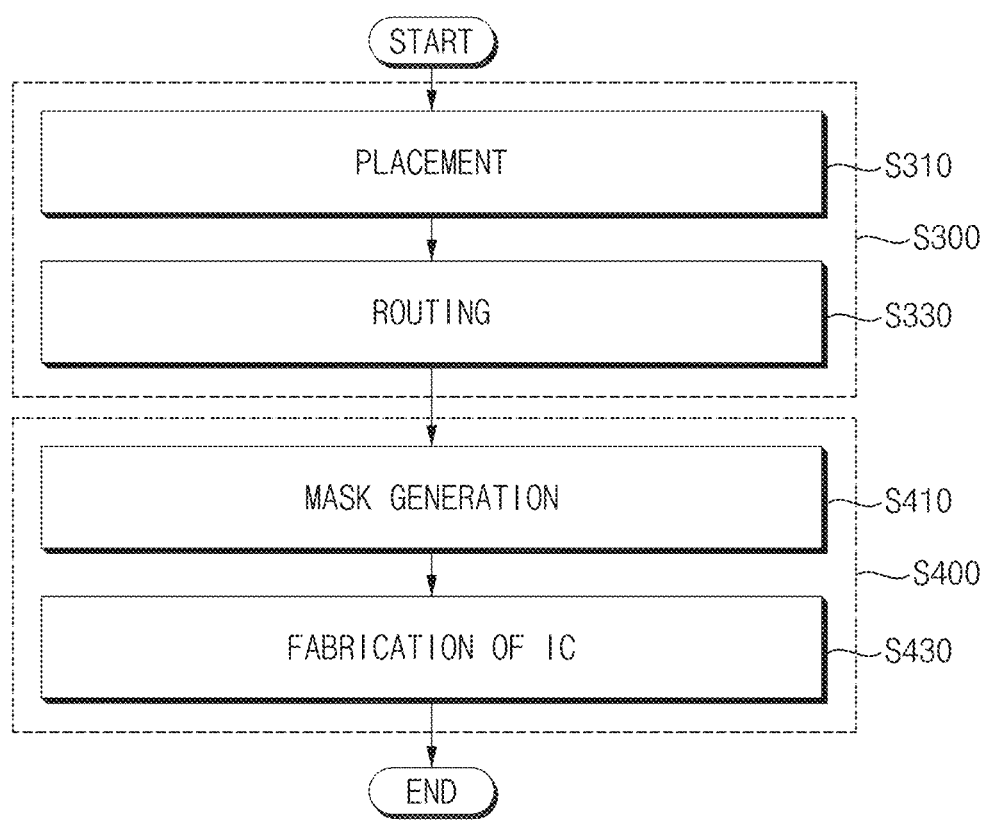
FIG. 17 is a flowchart illustrating a method of manufacturing an integrated circuit according to some implementations.

FIG. 17 is a flowchart illustrating a method of manufacturing an integrated circuit according to some implementations.

Referring to FIG. 17, according to some implementations, a method of manufacturing an integrated circuit may include an integrated circuit designing operation S300 and an integrated circuit manufacturing process S400. The integrated circuit designing operation S10 may include operations S310 and S330, in which a layout of an integrated circuit is designed using a tool for designing an integrated circuit. In this case, the tool for designing the integrated circuit may be a program including a plurality of instructions executed by a processor. The program may be stored on a memory. Accordingly, the integrated circuit designing operation S300 may be referred to as a computer-implemented method of designing an integrated circuit that may be executed by a processor.

The integrated circuit manufacturing process S400 corresponds to an operation of manufacturing a semiconductor device according to an integrated circuit based on a designed layout, and may be performed by a semiconductor process device.

An integrated circuit may be defined by a plurality of cells. For example, an integrated circuit may be designed using a cell library that includes characteristic information of the plurality of cells. For example, in a cell library, cell names, dimensions, gate widths, pins, delay characteristics, leakage currents, threshold voltages, and functions of cells may be defined. In some implementations, the cell library may be a standard cell library. The standard cell library may include information such as, for example, layout information and timing information of a plurality of standard cells. The cell library, including the standard cell library, may be stored in a computer-readable storage medium.

In operation S310, standard cells that define an integrated circuit are placed. Operation S310 may be performed, for example, by a processor using a placement and routing (P/R) tool. First, input data defining an integrated circuit is received. Here, the input data may be generated by synthesizing data defined in an abstract form for behaviors of an integrated circuit, for example, data defined in a register transfer level (RTL), by using a standard cell library. The input data may be, for example, a bit stream or a net list generated by synthesizing integrated circuits defined by a VHSIC hardware description language (VHDL) and a hardware description language (HDL) such as, for example, VERILOG.

Subsequently, a storage medium storing a standard cell library is accessed, and standard cells, which are selected from among a plurality of standard cells stored in the standard cell library according to the input data, are placed. The standard cells may include flip-flops operating based on TSPC. When the plurality of standard cells are placed, transistors included in the flip-flops are placed such that power consumption of the flip-flops is reduced and retention time of internal nodes of the flip-flops is increased.

In operation S330, nets are routed in the placed standard cells. The net may represent an equipotential in an equivalent circuit diagram of an integrated circuit. One net may correspond to one interconnection in a layout of an integrated circuit. The interconnection may correspond to, for example, a wiring structure including a plurality of wiring layers electrically connected to one another and vias. Each of the wiring layers may include, for example, a plurality of conductive patterns. The conductive patterns formed in the wiring layers, which may be disposed on different levels, may be electrically connected to one another through a via formed of a conductive material. In some implementations, the wiring layers may include a metal as a conductive material, and may be referred to as metal layers.

After operation S330, output data defining the integrated circuit may be provided to a semiconductor process device. Here, the output data may have a format including all layout information of standard cells. For example, the output data may include pattern information of all of the layers, and may have, for example, a graphic design system (GDS) II format. Further, the output data may have a format including external information of a standard cell such as, for example, a pin of a standard cell.

However, implementations are not limited thereto. For example, in some implementations, operation S300 may include various operations relating to designing an integrated circuit such as, for example, generation of a standard cell library, correction of a standard cell library, and verification of a layout. Further, in some implementations, operations S310 and S330 may correspond to a backend design process of an integrated circuit design process, and a frontend design process may be performed before operation S310. The frontend design process may include, for example, determination of a design specification, modeling and verification of an act level, designing of an RTL, verification of a function, synthesis of logic, and verification of a gate level (or simulation of a pre-layout).

In operation S410, a mask is generated based on a layout. For example, first, an optical proximity correction (OPC) may be performed based on the layout. The OPC refers to a process of changing a layout while reflecting an error according to an optical proximity effect. Subsequently, the mask may be manufactured according to the layout changed based on the OPC performance result. Then, the mask may be manufactured using a layout reflecting the OPC such as, for example, a GDS on which the OPC is reflected.

In operation S430, an integrated circuit is manufactured using the mask. For example, a semiconductor device in which an integrated circuit is implemented is formed by performing various semiconductor processes on a semiconductor substrate, such as a wafer, using the mask. The process using the mask may refer to, for example, a patterning process through a lithographic process. A desired pattern may be formed on a semiconductor substrate or a material layer through the patterning process. The semiconductor process may include, for example, a deposition process, an etching process, an ionizing process, and a cleaning process. The semiconductor process may further include, for example, a packaging process including mounting a semiconductor device on a printed circuit board (PCB) and sealing the semiconductor with a sealant. The semiconductor process may further include, for example, a test process of testing a semiconductor device or a package.

Figure 18:
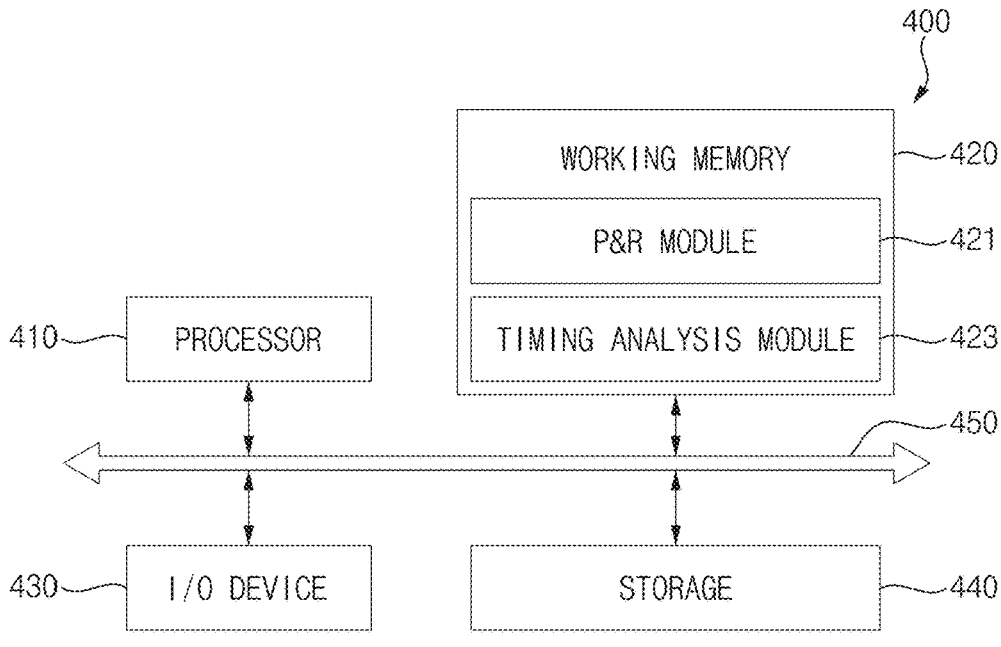
FIG. 18 illustrates an integrated circuit design system according to some implementations.

FIG. 18 illustrates an integrated circuit design system according to some implementations.

Referring to FIG. 18, an integrated circuit design system 400 includes a processor 410, a working memory 420, an input/output (I/O) device 430 an auxiliary storage 440, and a bus 450. The integrated circuit design system 400 may perform the integrated circuit design process S300 in FIG. 17. The integrated circuit design system 400 may be implemented by an integrated device, and accordingly, may be referred to as an integrated circuit design apparatus. The integrated circuit design system 400 may be provided as a dedicated apparatus for designing an integrated circuit of a semiconductor device, and may be a computer for driving various simulation tools or design tools.

The processor 410 may be configured to execute instructions performing at least one of various operations for designing an integrated circuit. The processor 410 may perform communication with the working memory 420, the I/O device 430, and the auxiliary storage 440 through the bus 450. The processor 410 may execute an operation of designing the integrated circuit by driving a placement and routing (P&R) module 421 and a timing analysis module 423 loaded in the working memory 420. For example, the processor 410 may execute an operation of designing the integrated circuit by executing instructions stored in the memory relating to P&R and timing analysis.

The working memory 420 may store the P&R module 421 (e.g., instructions relating to P&R) and the timing analysis module 423 (e.g., instructions relating to timing analysis). The P&R module 421 and the timing analysis module 423 may be loaded from the auxiliary storage 440 to the working memory 420. The working memory 420 may be a volatile memory such as, for example, static random access memory (SRAM) or dynamic random access memory (DRAM), or may be a nonvolatile memory such as, for example, phase change random access memory (PRAM) or a NOR flash memory.

The P&R module 421 may be, for example, a program including instructions for performing an arrangement operation according to operation S310 in FIG. 17, and a wiring operation according to operations S330 in FIG. 17. The timing analysis module 423 may be, for example, a program including instructions for determining whether timing constraints are satisfied. Determining whether timing constraints are satisfied may include, for example, performing a timing analysis on all timing paths in the arranged standard cells. The timing analysis module 423 may refer to, for example, a static timing analysis (STA) tool.

The I/O device 430 may control user inputs from user interface devices, and outputs. The I/O device 430 may include an input device such as, for example, a keyboard, a mouse, or a touchpad, and may receive input data defining an integrated circuit. The I/O device 430 may include an output device such as, for example, a display or a speaker, and may display, for example, an arrangement result, a wiring result, or a timing analysis result.

The auxiliary storage 440 may store various data related to the P&R module 421 and the timing analysis module 423. The auxiliary storage 440 may include, for example, a memory card (e.g., a multi-media card (MMC), an embedded MMC (eMMC), a secure digital (SD), a microSD, etc.), a solid state drive, and a hard disk drive.

Figure 19:
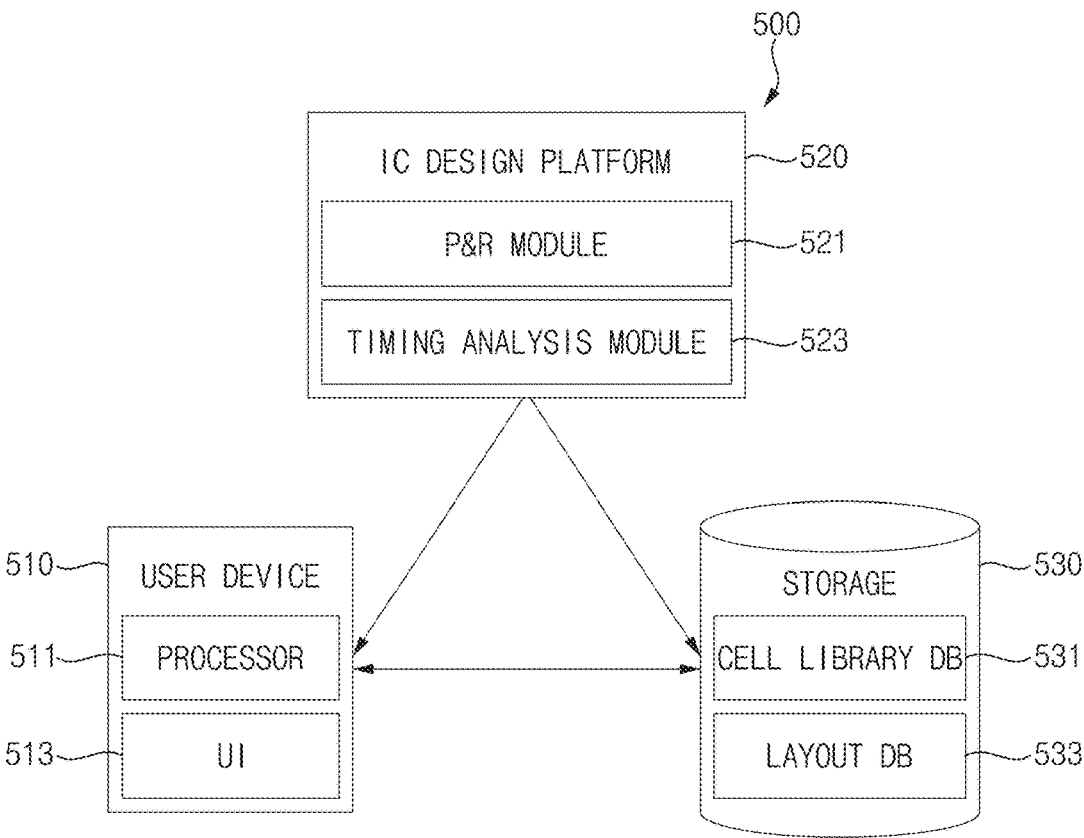
FIG. 19 illustrates an integrated circuit design system according to some implementations.

FIG. 19 illustrates an integrated circuit design system according to some implementations.

Referring to FIG. 19, an integrated circuit design system 500 includes a user device 510, an integrated circuit design platform 520, and an auxiliary storage 530. The integrated circuit design system 20 may perform the integrated circuit design operation S300 in FIG. 17.

The user device 510 includes a processor 511 and a user interface (UI) 513. The processor 511 may drive the integrated circuit design platform 520 according to a user input through the UI 513. The integrated circuit design platform 520 is a set of computer-readable instructions for designing an integrated circuit, and includes a P&R module 521 (e.g., corresponding to instructions relating to P&R) and a timing analysis module 523 (e.g., corresponding to instructions relating to timing analysis). The auxiliary storage 530 includes a cell library database (DB) 531 and a layout DB 533. The cell library DB 531 stores information relating to cells used for generating a layout of an integrated circuit, and the layout DB 533 stores information relating to a layout generated by the P&R module 521 (e.g., physical information of the layout).

FIG. 20 is a flow chart illustrating a method of designing an integrated circuit according to some implementations.

Referring to FIG. 20, input data defining the integrated circuit may be received (S510). Flip-flops operating based on TSPC are provided as a portion of a plurality of standard cells included in a cell library (S520).

Placement and routing are performed based on the input data and the standard cell library (S530) and output data defining the integrated circuit are provided based on a result of the placement and the routing (S540).

Aspects of the present disclosure may be applied to any electronic devices and systems. For example, some implementations may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

The foregoing is illustrative of implementations and is not to be construed as limiting thereof. Although a few implementations have been described, those skilled in the art will readily appreciate that many modifications are possible in the implementations without materially departing from the novel teachings and advantages of the present disclosure. Accordingly, all such modifications are intended to be included within the scope of the present disclosure as defined in the claims.

What is claimed is:

1. A flip-flop comprising:

a first precharge circuit connected between a power supply voltage and a first node, the first precharge circuit configured to selectively charge the first node based on a data input signal and a clock signal;

a first discharge circuit connected between the first node and a ground voltage, the first discharge circuit configured to selectively discharge the first node based on the data input signal;

a first inverter configured to output a first inverted signal by inverting a first signal of the first node;

a switching circuit configured to selectively connect a second node and a third node based on the clock signal;

a second discharge circuit connected between the second node and the ground voltage, the second discharge circuit configured to selectively discharge the second node based on the clock signal;

a second precharge circuit connected between the power supply voltage and a fourth node, the second precharge circuit configured to selectively charge the fourth node based on a second signal of the second node;

a third discharge circuit connected between the fourth node and the ground voltage, the third discharge circuit configured to selectively discharge the fourth node based on the clock signal, the first inverted signal and the second signal;

a second inverter configured to provide an output signal by inverting an inverted output signal of the fourth node; and a switching prevention circuit connected between the power supply voltage and the third node, the switching prevention circuit configured to prevent, based on the first signal, a switching of a voltage level of the second node in response to a toggling of the clock signal.

2. The flip-flop of claim 1, wherein the first precharge circuit includes a first p-channel metal-oxide semiconductor (PMOS) transistor and a second PMOS transistor that are connected in series between the power supply voltage and the first node, wherein the first PMOS transistor includes a source coupled to the power supply voltage, a drain coupled to the second PMOS transistor, and a gate configured to receive the data input signal, wherein the second PMOS transistor includes a source coupled to the first PMOS transistor, a drain coupled to the first node, and a gate configured to receive the clock signal, and wherein the first discharge circuit includes an n-channel metal-oxide semiconductor (NMOS) transistor and the NMOS transistor includes a drain coupled to the first node, a source coupled to the ground voltage, and a gate configured to receive the data input signal.

3. The flip-flop of claim 1, wherein the switching circuit includes a first p-channel metal-oxide semiconductor (PMOS) transistor, wherein the first PMOS transistor includes a source coupled to the third node, a drain coupled to the second node, and a gate configured to receive the clock signal, wherein the switching prevention circuit includes a second PMOS transistor, wherein the second PMOS transistor includes a source coupled to the power supply voltage, a drain coupled to the third node, and a gate configured to receive the first signal.

4. The flip-flop of claim 3, wherein:

the first signal has a logic high level based on the data input signal having a logic low level and the clock signal toggling, and the second PMOS transistor is configured to block a current path from the power supply voltage to the second node based on the first signal having the logic high level.

5. The flip-flop of claim 3, further comprising a retention strengthening circuit connected between the power supply voltage and the third node in parallel with the switching prevention circuit, wherein the retention strengthening circuit is configured to maintain a logic level of the second signal at the second node based on the inverted output signal.

6. The flip-flop of claim 5, wherein the retention strengthening circuit includes a third PMOS transistor, wherein the third PMOS transistor includes a source coupled to the power supply voltage, a drain coupled to the third node, and a gate configured to receive the inverted output signal.

7. The flip-flop of claim 6, wherein:

the inverted output signal has a logic low level based on the data input signal having the logic low level and the clock signal having the logic low level; and the third PMOS transistor is configured to maintain a logic level of the second signal by providing a current to the second node through the third node based on the inverted output signal having the logic low level.

8. The flip-flop of claim 1, wherein the second discharge circuit includes a first n-channel metal-oxide semiconductor (NMOS) transistor and a second NMOS transistor that are connected in series between the second node and the ground voltage, wherein the first NMOS transistor includes a drain coupled to the second node, a source coupled to a fifth node, and a gate coupled to the first node, and wherein the second NMOS transistor includes a drain coupled to the fifth node, a source coupled to the ground voltage, and a gate configured to receive the clock signal.

9. The flip-flop of claim 8, further comprising a retention strengthening circuit connected between the first node and the fifth node, wherein the retention strengthening circuit is configured to maintain a logic level of the first node based on the first inverted signal.

10. The flip-flop of claim 9, wherein the retention strengthening circuit includes a third NMOS transistor that includes a drain coupled to the first node, a source coupled to the fifth node, and a gate configured to receive the first inverted signal.

11. The flip-flop of claim 10, wherein:

the first inverted signal has a logic high level based on the data input signal having a logic low level and the clock signal having the logic high level; and the third NMOS transistor is configured to maintain the logic level of the first node based on the first inverted signal having the logic high level.

12. The flip-flop of claim 1, wherein the second precharge circuit includes a p-channel metal-oxide semiconductor (PMOS) transistor, wherein the PMOS transistor includes a source coupled to the power supply voltage, a gate coupled to the second node and a drain coupled to the fourth node, wherein the third discharge circuit includes a first n-channel metal-oxide semiconductor (NMOS) transistor, a second NMOS transistor, and a third NMOS transistor, wherein the first NMOS transistor, the second NMOS transistor, and the third NMOS transistor are connected in series between the fourth node and the ground voltage, wherein the first NMOS transistor includes a gate configured to receive the clock signal, wherein the second NMOS transistor includes a gate configured to receive the first inverted signal, and wherein the third NMOS transistor includes a gate coupled to the second node.

13. The flip-flop of claim 12, wherein:

the first inverted signal has a logic low level in response to the data input signal having the logic low level and the clock signal transitioning from the logic low level to a logic high level; and the second NMOS transistor is configured to be turned off based on the first inverted signal having the logic low level, and the second NMOS transistor, when turned off, is configured to prevent a glitch occurring at the fourth node in response to the data input signal having the logic low level and the clock signal transitioning from the logic low level to the logic high level.

14. A flip-flop comprising:

a first p-channel metal-oxide semiconductor (PMOS) transistor that includes a source coupled to a power supply voltage and a gate configured to receive a data input signal;

a second PMOS transistor that is connected between the first PMOS transistor and a first node, wherein the second PMOS transistor includes a gate configured to receive a clock signal;

a first n-channel metal-oxide semiconductor (NMOS) transistor that is connected between the first node and a ground voltage, wherein the first NMOS transistor includes a gate configured to receive the data input signal;

a third PMOS transistor that is connected between a second node and a third node, wherein the third PMOS transistor includes a gate configured to receive the clock signal;

a second NMOS transistor that includes a drain coupled to the second node and a gate coupled to the first node;

a third NMOS transistor that is connected between the second NMOS transistor and the ground voltage, wherein the third NMOS transistor includes a gate configured to receive the clock signal;

a first inverter configured to output a first inverted signal by inverting a first signal of the first node;

a fourth PMOS transistor that is connected between the power supply voltage and a fourth node, wherein the fourth PMOS transistor includes a gate coupled to the second node;

a fourth NMOS transistor that includes a drain coupled to the fourth node and a gate configured to receive the clock signal;

a fifth NMOS transistor that includes a drain coupled to the fourth NMOS transistor and a gate configured to receive the first inverted signal;

a sixth NMOS transistor that is connected between the fifth NMOS transistor and the ground voltage, wherein the sixth NMOS transistor includes a gate coupled to the second node;

a second inverter configured to provide an output signal by inverting an inverted output signal of the fourth node;

a fifth PMOS transistor that is connected between the power supply voltage and the third node, wherein the fifth PMOS transistor includes a gate configured to receive the first signal; and a sixth PMOS transistor that is connected between the power supply voltage and the third node in parallel with the fifth PMOS transistor, wherein the sixth PMOS transistor includes a gate configured to receive the inverted output signal.

15. The flip-flop of claim 14, wherein, in response to the first PMOS transistor being turned on based on the data input signal having a logic low level and the second PMOS transistor being turned on based on the clock signal having a logic low level, the first PMOS transistor and the second PMOS transistor are configured to charge the first node, the first NMOS transistor is turned off based on the data input signal, the third NMOS transistor is turned off based on the clock signal, and in response to the first NMOS transistor being turned off and the third NMOS transistor being turned off, the first NMOS transistor and the third NMOS transistor block a discharging path between the first node and the ground voltage.

16. The flip-flop of claim 14, wherein the first NMOS transistor is turned on to discharge the first node in response to the data input signal having a logic high level, and in response to the first NMOS transistor being turned on, the first PMOS transistor is turned off to block a charging path between the power supply voltage and the first node.

17. The flip-flop of claim 14, wherein the third PMOS transistor is turned on based on the clock signal having a logic low level, the fifth PMOS transistor is turned on based on the first signal having a logic low level, and in response to the third PMOS transistor being turned on and the fifth PMOS transistor being turned on, the third PMOS transistor and the fifth PMOS transistor charge the second node, and the third NMOS transistor is turned off based on the clock signal to block a discharging path between the second node and the ground voltage.

18. The flip-flop of claim 14, wherein the second NMOS transistor is turned on based on the first signal having a logic high level, the third NMOS transistor is turned on based on the clock signal having a logic high level, in response to the second NMOS transistor being turned on and the third NMOS transistor being turned on, the second NMOS transistor and the third NMOS transistor discharge the second node, and the third PMOS transistor is turned off based on the clock signal to block a charging path between the power supply voltage and the second node.

19. The flip-flop of claim 14, wherein, in response to the fourth PMOS transistor being turned on based on a voltage level of the second node having a logic low level, the sixth NMOS transistor is turned off based on the voltage level of the second node to block a discharging path between the fourth node and the ground voltage.

20. An integrated circuit comprising:

a clock generator configured to generate a clock signal having a true single phase; and a plurality of flip-flops connected in series and configured to operate based on the clock signal, wherein each of the plurality of flip-flops includes:

a first precharge circuit connected between a power supply voltage and a first node, the first precharge circuit configured to selectively charge the first node based on a data input signal and the clock signal;

a first discharge circuit connected between the first node and a ground voltage, the first discharge circuit configured to selectively discharge the first node based on the data input signal;

a first inverter configured to output a first inverted signal by inverting a first signal of the first node;

a switching circuit configured to selectively connect a second node and a third node based on the clock signal;

a second discharge circuit connected between the second node and the ground voltage, the second discharge circuit configured to selectively discharge the second node based on the clock signal;

a second precharge circuit connected between the power supply voltage and a fourth node, the second precharge circuit configured to selectively charge the fourth node based on a second signal of the second node;

a third discharge circuit connected between the fourth node and the ground voltage, the third discharge circuit configured to selectively discharge the fourth node based on the clock signal, the first inverted signal, and the second signal;

a second inverter configured to provide an output signal by inverting an inverted output signal of the fourth node;

a switching prevention circuit connected between the power supply voltage, the switching prevention circuit configured to prevent, based on the first signal, a switching of a voltage level of the second node in response to a toggling of the clock signal;

a first a retention strengthening circuit connected between the power supply voltage and the third node in parallel with the switching prevention circuit, the first retention strengthening circuit configured to maintain a logic level of the second signal based on the inverted output signal; and a second retention strengthening circuit connected between the first node and a fifth node in the second discharge circuit, the second retention strengthening circuit configured to maintain a logic level of the first node based on the first inverted signal.

\* \* \* \* \*